US010510841B2

(12) United States Patent
Nakamura et al.

(10) Patent No.: US 10,510,841 B2
(45) Date of Patent: Dec. 17, 2019

(54) METHOD OF MANUFACTURING A SILICON CARBIDE SEMICONDUCTOR DEVICE

(71) Applicant: SHINDENGEN ELECTRIC MANUFACTURING CO., LTD., Tokyo (JP)

(72) Inventors: Shunichi Nakamura, Saitama (JP); Akihiko Sugai, Saitama (JP); Tetsuto Inoue, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 16/388,807

(22) Filed: Apr. 18, 2019

(65) Prior Publication Data

US 2019/0252498 A1    Aug. 15, 2019

Related U.S. Application Data

(62) Division of application No. 15/314,095, filed as application No. PCT/JP2015/076814 on Sep. 18, 2015.

(30) Foreign Application Priority Data

Nov. 26, 2014    (WO) .................. PCT/JP2014/081232

(51) Int. Cl.
*H01L 21/00* (2006.01)
*H01L 31/0312* (2006.01)
(Continued)

(52) U.S. Cl.
CPC ...... *H01L 29/1045* (2013.01); *H01L 21/0465* (2013.01); *H01L 29/0696* (2013.01);
(Continued)

(58) Field of Classification Search
CPC ............ H01L 21/0465; H01L 29/0696; H01L 29/086; H01L 29/1095; H01L 29/1608;
(Continued)

(56) References Cited

U.S. PATENT DOCUMENTS 5,804,483 A    9/1998  Harris
5,877,041 A    3/1999  Fuller
(Continued)

FOREIGN PATENT DOCUMENTS

EP    0822600 A1    2/1998
JP    2001-94097 A    4/2001
(Continued)

OTHER PUBLICATIONS

International Search Report in International Application No. PCT/JP2015/076814 dated Dec. 15, 2015.
(Continued)

*Primary Examiner* — Kimberly N Rizkallah
*Assistant Examiner* — Dilinh P Nguyen
(74) *Attorney, Agent, or Firm* — Hauptman Ham, LLP

(57) ABSTRACT

A silicon carbide semiconductor device includes: n type regions formed on a surface of the n− type epitaxial layer; p type body regions formed at positions deeper than the n type regions; p− type channel regions each reaching the p type body region; and n++ type source regions formed toward the p type body region from the front surface side of the epitaxial layer, and the p− type channel regions and the n++ type source regions are formed at a planar position where the n type region remains between the p− type channel region and the n++ type source region, and out of boundary surfaces which are formed between the p− type channel region and the n type regions, the boundary surface
(Continued)

on an outer peripheral side is positioned inside an outer peripheral surface 116a of the p type body region as viewed in a plan view.

8 Claims, 14 Drawing Sheets

(51) Int. Cl.
| | |
|---|---|
| H01L 29/10 | (2006.01) |
| H01L 21/04 | (2006.01) |
| H01L 29/06 | (2006.01) |
| H01L 29/08 | (2006.01) |
| H01L 29/16 | (2006.01) |
| H01L 29/66 | (2006.01) |
| H01L 29/739 | (2006.01) |
| H01L 29/78 | (2006.01) |

(52) U.S. Cl.
CPC ........ *H01L 29/086* (2013.01); *H01L 29/1095* (2013.01); *H01L 29/1608* (2013.01); *H01L 29/66068* (2013.01); *H01L 29/7395* (2013.01); *H01L 29/7802* (2013.01)

(58) Field of Classification Search
CPC ........... H01L 29/66068; H01L 29/7395; H01L 29/7802; H01L 21/02376; H01L 21/02378; H01L 21/02527; H01L 21/02529; H01L 29/1602; H01L 33/34; H01L 21/02444; H01L 21/0405; H01L 21/3146; H01L 21/8206

USPC .................................. 438/105, 931; 257/77
See application file for complete search history.

(56) References Cited

U.S. PATENT DOCUMENTS

| | | | |
|---|---|---|---|
| 5,917,203 A * | 6/1999 | Bhatnagar | H01L 29/1095 257/139 |
| 2007/0007537 A1 | 1/2007 | Ogura et al. | |
| 2010/0258815 A1 | 10/2010 | Tarui | |
| 2013/0092978 A1 | 4/2013 | Sugawara et al. | |
| 2014/0061675 A1 | 3/2014 | Watanabe et al. | |
| 2014/0145209 A1 | 5/2014 | Kumagai | |
| 2015/0287817 A1 | 10/2015 | Kubota et al. | |

FOREIGN PATENT DOCUMENTS

| | | |
|---|---|---|
| JP | 2007-13058 A | 1/2007 |
| JP | 4173629 B2 | 10/2008 |
| JP | 4502407 B2 | 7/2010 |
| JP | 2012-142585 A | 7/2012 |
| JP | 2013-89700 A | 5/2013 |
| JP | 2014-131008 A | 7/2014 |

OTHER PUBLICATIONS

Extended European Search Report in EP Application No. 15862704.2, dated Jun. 18, 2018, 14pp.

* cited by examiner

METHOD OF MANUFACTURING A SILICON CARBIDE SEMICONDUCTOR DEVICE

RELATED APPLICATIONS

The present application is a divisional application of U.S. application Ser. No. 15/314,095, filed Nov. 28, 2016, which is a National Phase entry of International Application No. PCT/JP2015/076814, filed Sep. 18, 2015, which claims priority of International Application No. PCT/JP2014/081232, filed Nov. 26, 2014.

TECHNICAL FIELD

The present invention relates to a silicon carbide semiconductor device and a method of manufacturing the silicon carbide semiconductor device.

BACKGROUND ART

FIG. 18 is a cross-sectional view of a main part of a conventional silicon carbide semiconductor device 700.

As shown in FIG. 18, a conventional silicon carbide semiconductor device 700 includes: an $n^+$ type low resistance silicon carbide substrate 710; an $n^-$ type epitaxial layer 712 formed on the $n^+$ type low resistance silicon carbide substrate 710; p type body regions 716 formed on a surface of the $n^-$ type epitaxial layer 712; channel regions 718 formed on a surface of the p type body region 716; $n^{++}$ type source regions 720 and $p^{++}$ type body contact regions 722; and gate electrodes 726 formed on at least the channel region 718 with a gate insulating film 724 interposed therebetween. In FIG. 18, numeral 728 indicates an interlayer insulation film, numeral 730 indicates a source electrode, and numeral 732 indicates a drain electrode.

CITATION LIST

Patent Literature

[PTL 1] Japanese patent No. 4502407
[PTL 2] Japanese patent No. 4173629

SUMMARY OF INVENTION

Technical Problem

In a power MOSFET which uses silicon, a method has been popularly used where a channel region is formed in a self-aligned manner by making use of a double diffusion method. Also in a power MOSFET which uses silicon carbide, a method (first method) substantially equal to a double diffusion method is disclosed (see the above-mentioned patent literature 1, for example). However, in the first method, a diffusion coefficient of an impurity in silicon carbide is extremely small and hence, diffusion processing which is to be performed at a high temperature for a long time is necessary for forming a channel having a channel length sufficiently long for preventing the occurrence of a short channel effect. Accordingly, the first method is not useful practically.

On the other hand, there has been also proposed a method (second method) where a channel region is formed in a self-aligned manner by making use of side walls (see the above-mentioned patent literature 2, for example). However, in the second method, to form a channel region having a channel length sufficiently long for preventing the occurrence of a short channel effect, it is necessary to form a film ($SiO_2$ film, for example) which constitutes a side wall with a large thickness. Accordingly, an upper surface of the side wall is remarkably rounded and hence, there arises a drawback that it is extremely difficult to form a channel region with an accurate channel length by such a method.

In view of the above, a method (third method) is considered where a channel region is formed by forming a p type body region and, thereafter, by forming an $n^{++}$ source region on the p type body region in an aligned manner. However, in this third method, the channel region is formed by performing a masking step twice and hence, there arises a drawback that it is difficult to accurately define a channel length due to an error in mask alignment.

As a result, in this third method, it is necessary to set the channel length slightly longer by taking into account an error in mask alignment. Accordingly, a channel resistance and eventually an ON resistance of a semiconductor device are increased, and gate capacitance is increased.

The present invention has been made to overcome the above-mentioned drawback, and it is an object of the present invention to provide a silicon carbide semiconductor device and a method of manufacturing the silicon carbide semiconductor device where a channel region can be formed by performing a masking step once, and a channel length sufficiently long for preventing the occurrence of a short channel effect can be accurately defined in a practical process.

Solution to Problem

[1] A silicon carbide semiconductor device according to a first aspect of the present invention includes:
an epitaxial layer of a first conductive type;
a first semiconductor region of a first conductive type formed on a surface of the epitaxial layer of the first conductive type, and having higher impurity concentration than the epitaxial layer of the first conductive type;
a body region of a second conductive type formed at a position deeper than the first semiconductor region of the first conductive type;
a channel region of a second conductive type formed such that the channel region of the second conductive type penetrates the first semiconductor region of the first conductive type from a surface side of the epitaxial layer of the first conductive type and reaches the body region of the second conductive type, the channel region of the second conductive type having lower impurity concentration than the body region of the second conductive type;
a second semiconductor region of a first conductive type formed toward the body region of the second conductive type from the front surface side of the epitaxial layer of the first conductive type, the second semiconductor region of the first conductive type having higher impurity concentration than the first semiconductor region of the first conductive type;
a body contact region of a second conductive type formed such that the body contact region of the second conductive type penetrates the first semiconductor region of the first conductive type from the front surface side of the epitaxial layer of the first conductive type and reaches the body region of the second conductive type, the body contact region of the second conductive type having higher impurity concentration than the body region of the second conductive type; and
a gate electrode formed on at least the channel region of the second conductive type with a gate insulating film interposed therebetween, wherein the channel region of the second conductive type and the second semiconductor region of the first conductive type are formed at a planar position where the first semiconductor region of the first conductive type remains between the channel region of the second conductive type and the second semiconductor region of the first conductive type, and out of boundary surfaces which are formed between the channel region of the second conductive type and the first semiconductor regions of the first conductive type, the boundary surface on an outer peripheral side is positioned inside an outer peripheral surface of the body region of the second conductive type as viewed in a plan view.

In the silicon carbide semiconductor device according to the first aspect of the present invention, the channel region of the second conductive type may be also referred to as "the channel region of the second conductive type which is positioned in a region which penetrates the first semiconductor region of the first conductive type from the front surface side of the epitaxial layer of the first conductive type and reaches the body region of the second conductive type, and has lower impurity concentration than the body region of the second conductive type". The body contact region of the second conductive type may be also referred to as "the body contact region of the second conductive type which is positioned in a region which penetrates the first semiconductor region of the first conductive type from the front surface side of the epitaxial layer of the first conductive type and reaches the body region of the second conductive type, and has higher impurity concentration than the body region of the second conductive type".

[2] In the silicon carbide semiconductor device according to the first aspect of the present invention, it is preferable that an end portion of the gate electrode be positioned on the first semiconductor region of the first conductive type which remains between the channel region of the second conductive type and the second semiconductor region of the first conductive type as viewed in a plan view.

[3] In the silicon carbide semiconductor device according to the first aspect of the present invention, it is preferable that an end portion of the gate electrode be positioned on the second semiconductor region of the first conductive type as viewed in a plan view.

[4] In the silicon carbide semiconductor device according to the first aspect of the present invention, it is preferable that between the first semiconductor region of the first conductive type which remains between the channel region of the second conductive type and the second semiconductor region of the first conductive type and the second semiconductor region of the first conductive type, a third semiconductor region of a first conductive type having impurity concentration higher than the first semiconductor region of the first conductive type and lower than the second semiconductor region of the first conductive type be formed, and an end portion of the gate electrode be positioned on the third semiconductor region of the first conductive type as viewed in a plan view.

[5] A silicon carbide semiconductor device according to a second aspect of the present invention includes:

an epitaxial layer of a first conductive type;

a body region of a second conducive type formed at a predetermined depth position on a surface side of the epitaxial layer of the first conductive type;

a channel region of a second conductive type formed such that the channel region of the second conductive type reaches the body region of the second conductive type from the front surface side of the epitaxial layer of the first conductive type, the channel region of the second conductive type having lower impurity concentration than the body region of the second conductive type;

a second semiconductor region of a first conductive type formed toward the body region of the second conductive type from the front surface side of the epitaxial layer of the first conductive type, the second semiconductor region of the first conductive type having higher impurity concentration than the epitaxial layer of the first conductive type, a body contact region of a second conductive type formed such that the body contact region of the second conductive type reaches the body region of the second conductive type from the front surface side of the epitaxial layer of the first conductive type, the body contact region of the second conductive type having higher impurity concentration than the body region of the second conductive type, and a gate electrode formed on at least the channel region of the second conductive type with a gate insulating film interposed therebetween, wherein the channel region of the second conductive type and the second semiconductor region of the first conductive type are formed at a planar position where the epitaxial layer of the first conductive type remains between the channel region of the second conductive type and the second semiconductor region of the first conductive type, and out of boundary surfaces which are formed between the channel region of the second conductive type and the epitaxial layers of the first conductive type, the boundary surface on an outer peripheral side is positioned inside an outer peripheral surface of the body region of the second conductive type as viewed in a plan view.

In the silicon carbide semiconductor device according to the second aspect of the present invention, the channel region of the second conductive type may be also referred to as "the channel region of the second conductive type which is positioned in a region which reaches the body region of the second conductive type from the front surface side of the epitaxial layer of the first conductive type, and has lower impurity concentration than the body region of the second conductive type". The body contact region of the second conductive type may be also referred to as "the body contact region of the second conductive type which is positioned in a region which reaches the body region of the second conductive type from the front surface side of the epitaxial layer of the first conductive type, and has higher impurity concentration than the body region of the second conductive type".

[6] In the silicon carbide semiconductor device according to the second aspect of the present invention, it is preferable that an end portion of the gate electrode be positioned on the epitaxial layer of the first conductive type which remains between the channel region of the second conductive type and the second semiconductor region of the first conductive type as viewed in a plan view.

[7] In the silicon carbide semiconductor device according to the second aspect of the present invention, it is preferable that an end portion of the gate electrode be positioned on the second semiconductor region of the first conductive type as viewed in a plan view.

[8] In the silicon carbide semiconductor device according to the second aspect of the present invention, it is preferable that between the epitaxial layer of the first conductive type which remains between the channel region of the second conductive type and the second semiconductor region of the first conductive type and the second semiconductor region of the first conductive type, a third semiconductor region of a first conductive type having impurity concentration higher than the epitaxial layer of the first conductive type and lower than the second semiconductor region of the first conductive type be formed, and an end portion of the gate electrode be positioned on the third semiconductor region of the first conductive type as viewed in a plan view.

[9]

A method of manufacturing the silicon carbide semiconductor device according to a third aspect of the present invention includes the steps of:

preparing a silicon carbide semiconductor substrate provided with the epitaxial layer of the first conductive type;

forming the body region of the second conductive type on the front surface of the epitaxial layer of the first conductive type such that a depth position indicative of maximum concentration of an impurity of a second conductive type is greater than a depth position which forms a bottom surface of the channel region of the second conductive type;

forming the first semiconductor region of the first conductive type on a surface of the body region of the second conductive type;

forming the channel region of the second conductive type, the second semiconductor region of the first conductive type and a body contact region of a second conductive type in the first semiconductor region of the first conductive type; and forming the gate electrode on at least the channel region of the second conductive type with a gate insulating film interposed therebetween, wherein in the step of forming the channel region of the second conductive type, the second semiconductor region of the first conductive type and the body contact region of the second conductive type, the channel region of the second conductive type, the second semiconductor region of the first conductive type and the body contact region of the second conductive type are formed at a planar position where the first semiconductor region of the first conductive type remains between the channel region of the second conductive type and the second semiconductor region of the first conductive type, and out of boundary surfaces which are formed between the channel region of the second conductive type and the first semiconductor regions of the first conductive type, the boundary surface on an outer peripheral side is positioned inside an outer peripheral surface of the body region of the second conductive type as viewed in a plan view.

In the method of manufacturing the silicon carbide semiconductor device according to the third aspect of the present invention, it is preferable that in the step of forming the gate electrode, the gate electrode be formed such that an end portion of the gate electrode is positioned on the first semiconductor region of the first conductive type which remains between the channel region of the second conductive type and the second semiconductor region of the first conductive type as viewed in a plan view.

In the method of manufacturing the silicon carbide semiconductor device according to the third aspect of the present invention, it is preferable that in the step of forming the gate electrode, an end portion of the gate electrode be positioned on the second semiconductor region of the first conductive type as viewed in a plan view.

In the method of manufacturing the silicon carbide semiconductor device according to the third aspect of the present invention, it is preferable that in the step of forming the channel region of the second conductive type, the second semiconductor region of the first conductive type and a body contact region of a second conductive type, between the first semiconductor region of the first conductive type which remains between the channel region of the second conductive type and the second semiconductor region of the first conductive type and the second semiconductor region of the first conductive type, a third semiconductor region of a first conductive type having impurity concentration higher than the first semiconductor region of the first conductive type and lower than the second semiconductor region of the first conductive type be formed, and in the step of forming the gate electrode, the gate electrode be formed such that an end portion of the gate electrode is positioned on the third semiconductor region of the first conductive type as viewed in a plan view.

[10]

A method of manufacturing the silicon carbide semiconductor device according to a fourth aspect of the present invention includes the steps of:

preparing a silicon carbide semiconductor substrate provided with the epitaxial layer of the first conductive type;

forming the body region of the second conductive type on a surface of the epitaxial layer of the first conductive type within a predetermined depth region;

forming the channel region of the second conductive type, the second semiconductor region of the first conductive type and a body contact region of a second conductive type on the front surface of the epitaxial layer of the first conductive type; and forming the gate electrode on at least the channel region of the second conductive type with a gate insulating film interposed therebetween, wherein in the step of forming the channel region of the second conductive type, the second semiconductor region of the first conductive type and the body contact region of the second conductive type, the channel region of the second conductive type, the second semiconductor region of the first conductive type and the body contact region of the second conductive type are formed at a planar position where the epitaxial layer of the first conductive type remains between the channel region of the second conductive type and the second semiconductor region of the first conductive type, and out of boundary surfaces which are formed between the channel region of the second conductive type and the epitaxial layers of the first conductive type, the boundary surface on an outer peripheral side of the body region of the second conductive type is positioned inside an outer peripheral surface of the body region of the second conductive type as viewed in a plan view.

In the method of manufacturing the silicon carbide semiconductor device according to the fourth aspect of the present invention, it is preferable that in the step of forming the gate electrode, the gate electrode be formed such that an end portion of the gate electrode is positioned on the epitaxial layer of the first conductive type which remains between the channel region of the second conductive type and the second semiconductor region of the first conductive type as viewed in a plan view.

In the method of manufacturing the silicon carbide semiconductor device according to the fourth aspect of the present invention, it is preferable that in the step of forming the gate electrode, the gate electrode be formed such that an end portion of the gate electrode is positioned on the second semiconductor region of the first conductive type as viewed in a plan view.

In the method of manufacturing the silicon carbide semiconductor device according to the fourth aspect of the present invention, it is preferable that in the step of forming the channel region of the second conductive type, the second semiconductor region of the first conductive type and a body contact region of a second conductive type, between the epitaxial layer of the first conductive type which remains between the channel region of the second conductive type and the second semiconductor region of the first conductive type and the second semiconductor region of the first conductive type, a third semiconductor region of a first conductive type having impurity concentration higher than the epitaxial layer of the first conductive type and lower than the second semiconductor region of the first conductive type be formed, and in the step of forming the gate electrode, the gate electrode be formed such that an end portion of the gate electrode is positioned on the third semiconductor region of the first conductive type as viewed in a plan view.

Advantageous Effects of Invention

According to the silicon carbide semiconductor device and the method of manufacturing the silicon carbide semiconductor device of the present invention, unlike the above-mentioned third method, the channel region can be formed by performing the masking step once and hence, it is possible to eliminate a drawback that it is difficult to accurately define a channel length due to an error in mask alignment. Further, according to the silicon carbide semiconductor device and the method of manufacturing the silicon carbide semiconductor device of the present invention, a predetermined channel length can be defined without making use of a double diffusion method and side walls adopted by the above-mentioned first method and second method and hence, a channel length sufficiently long for preventing the occurrence of a short channel effect can be accurately defined in a practical process.

JP-A-2007-13058 discloses a silicon carbide semiconductor device (MOSFET800) provided with a channel region of a second conductive type (p type layer 827) which is formed such that the channel region of the second conductive type penetrates a first semiconductor region of a first conductive type (n type stacked channel layer 824) and reaches a body region of a second conductive type (p type body layer 832) (see FIG. 19). However, in the silicon carbide semiconductor device 800, a bottom surface of the p type layer 827 is exposed to an n⁻ type drift layer 834 and hence, with respect to a boundary surface between the p type layer 827 and the n⁻ type drift layer 834, a depletion layer extends toward a surface of the p type layer 827 from the boundary surface at a bottom surface portion of the p type layer 827 and hence, a drawback such as a change in a threshold value of a transistor or the occurrence of a punch-through is liable to take place.

To the contrary, according to the silicon carbide semiconductor device of the present invention, the channel region of the second conductive type and the second semiconductor region of the first conductive type are formed at a planar position where out of boundary surfaces which are formed between the channel region of the second conductive type and the first semiconductor regions of the first conductive type, the boundary surface on an outer peripheral side is positioned inside an outer peripheral surface of the body region of the second conductive type as viewed in a plan view and hence, the whole bottom surface of the channel region of the second conductive type is covered by the body region of the second conductive type. Accordingly, there is no possibility that the depletion layer extends to the front surface of the channel region of the second conductive type from the bottom surface of the channel region of the second conductive type and hence, a drawback such as a change in a threshold value of a transistor or the occurrence of a punch-through minimally takes place.

JP-A-2014-29952 discloses a silicon carbide semiconductor device (MOSFET900) provided with a channel region of a second conductive type which is formed such that the channel region of the second conductive type penetrates a first semiconductor region of a first conductive type (first region 911) and reaches a body region of a second conductive type (base region 920) (see FIG. 20). The channel region of the second conductive type is a region 991 where the base region 920 and the first region 911 overlap with each other. In such a silicon carbide semiconductor device 900, however, as can be also understood from FIG. 4 and FIG. 5 of JP-A-2014-29952, the region 991 is formed by performing a masking step twice and hence, a drawback that it is difficult to accurately define a channel length due to an error in mask alignment cannot be overcome.

BRIEF DESCRIPTION OF DRAWINGS

FIG. 1A is a cross-sectional view of a main part of the silicon carbide semiconductor device 100, FIG. 1B is a cross-sectional view taken along a line A1-A1' in FIG. 1A, and FIG. 1C is a cross-sectional view taken along a line A2-A2' in FIG. 1A.

FIG. 2A is a cross-sectional view of a main part showing a step of manufacturing the silicon carbide semiconductor device 100 according to the embodiment 1, and FIG. 2B is a graph showing an impurity concentration profile along a line A3-A3' in FIG. 2A.

FIG. 3A is a cross-sectional view of the main part showing a step of manufacturing the silicon carbide semiconductor device 100 according to the embodiment 1, and FIG. 3B is a graph showing an impurity concentration profile along a line A3-A3' in FIG. 3A.

FIG. 4A is a cross-sectional view of the main part showing a step of manufacturing the silicon carbide semiconductor device 100 according to the embodiment 1, and FIG. 4B is a graph showing an impurity concentration profile along a line A3-A3' in FIG. 4A.

FIG. 5A is a cross-sectional view of the main part showing a step of manufacturing the silicon carbide semiconductor device 100 according to the embodiment 1, and FIG. 5B is a graph showing an impurity concentration profile along a line A3-A3' in FIG. 5A.

FIG. 14A is a cross-sectional view of a main part of the silicon carbide semiconductor device 108, FIG. 14B is a cross-sectional view taken along a line A1-A1' in FIG. 14A, and FIG. 14C is a cross-sectional view taken along a line A2-A2' in FIG. 14A.

FIG. 15A is a cross-sectional view of a main part showing a step of manufacturing the silicon carbide semiconductor device 108 according to the embodiment 5, and FIG. 15B is a graph showing an impurity concentration profile along a line A3-A3' in FIG. 15A.

FIG. 16A is a cross-sectional view of a main part showing a step of manufacturing the silicon carbide semiconductor device 108 according to the embodiment 5, and FIG. 16B is a graph showing an impurity concentration profile along a line A3-A3' in FIG. 16A.

In FIG. 19, numeral 800 indicates a MOSFET, numerals 820 indicate source electrodes, numerals 822 indicate $n^+$ type source layers, numerals 824 indicate n type stack channel layers, numeral 826 indicates a gate oxide film, numerals 827 indicate p type layers, numeral 828 indicates a gate electrode, numerals 832 indicate p type body layers, numeral 834 indicates an $n^-$ type drift layer, numeral 836 indicates an $n^+$ type drain layer, and numeral 838 indicates a drain electrode.

In FIG. 20, numeral 900 indicates a transistor, numerals 901 indicate structural bodies, a numeral 901a indicates an upper surface, numeral 910 indicates a drift region, numeral 911 indicates a first region, numeral 912 indicates a second region, numeral 915 indicates a substrate, numeral 915a indicates a first surface, numeral 915b indicates a second surface, numeral 920 indicates a base region, numeral 920b indicates a lower end, numeral 930 indicates a source region, numeral 940 indicates a gate insulating film, numeral 950 indicates a gate electrode, numeral 951 indicates a source electrode, numeral 952 indicates a drain electrode, numerals 955 indicate contacts, and numeral 980 indicates an interlayer insulation film.

DESCRIPTION OF EMBODIMENTS

Figure 1A:
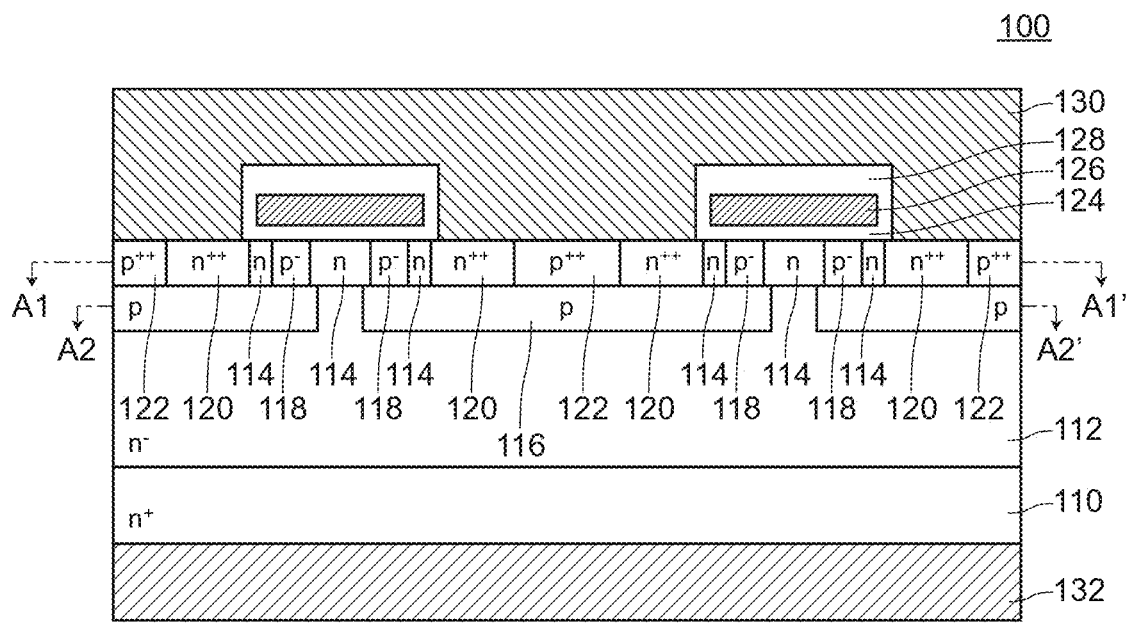
FIG. 1A to FIG. 1C are views for describing a silicon carbide semiconductor device 100 according to an embodiment 1.

Hereinafter, a silicon carbide semiconductor device and a method of manufacturing the silicon carbide semiconductor device of the present invention are described in conjunction with embodiments shown in the drawings.

Embodiment 1

1. Silicon Carbide Semiconductor Device According to Embodiment 1

A silicon carbide semiconductor device 100 according to an embodiment 1 is a silicon carbide semiconductor device according to the first mode of the present invention. The silicon carbide semiconductor device 100 according to the embodiment 1 is a power MOSFET.

In the embodiments described hereinafter, impurity concentration of a conductive type is set such that the impurity concentration is increased in order of $n^-$, n, $n^+$, $n^{++}$ with respect to an n type, and in order of $p^-$, p, $p^{++}$ with respect to a p type. These symbols roughly indicate the relative magnitude of impurity concentration. For example, although an $n^+$ type region has impurity concentration higher than an $n^-$ type region and an n type region and lower than an $n^{++}$ type region, it is not always the case where $n^+$ type regions have the same impurity concentration.

Figure 1B:
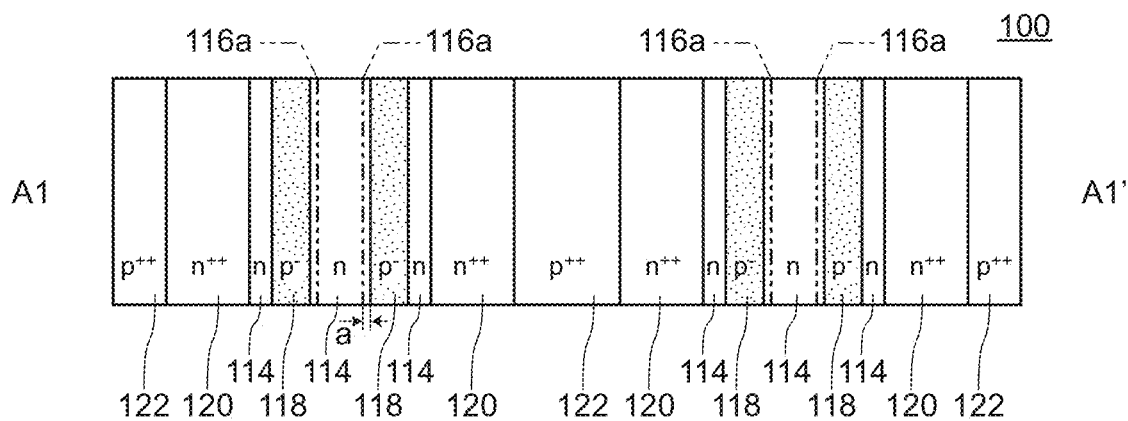
Figure 1C:
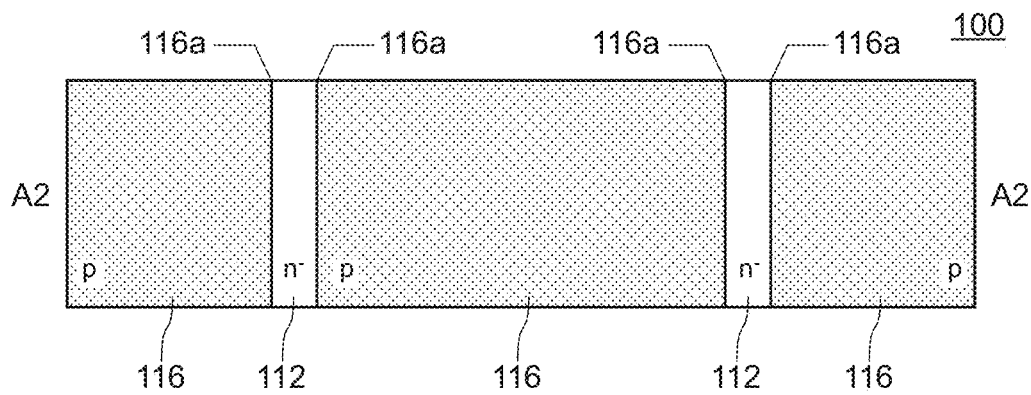
Figure 2A:
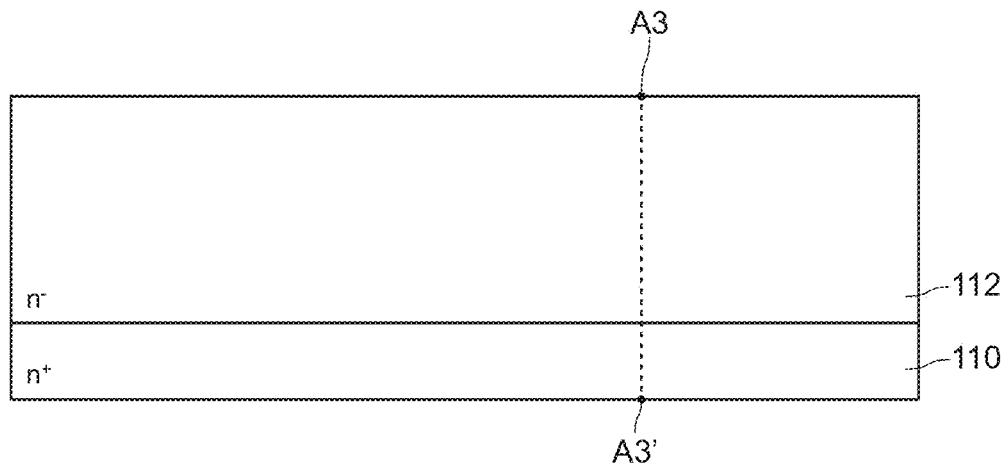
FIG. 2A and FIG. 2B are views for describing a step of manufacturing the silicon carbide semiconductor device 100 according to the embodiment 1.
Figure 2B:
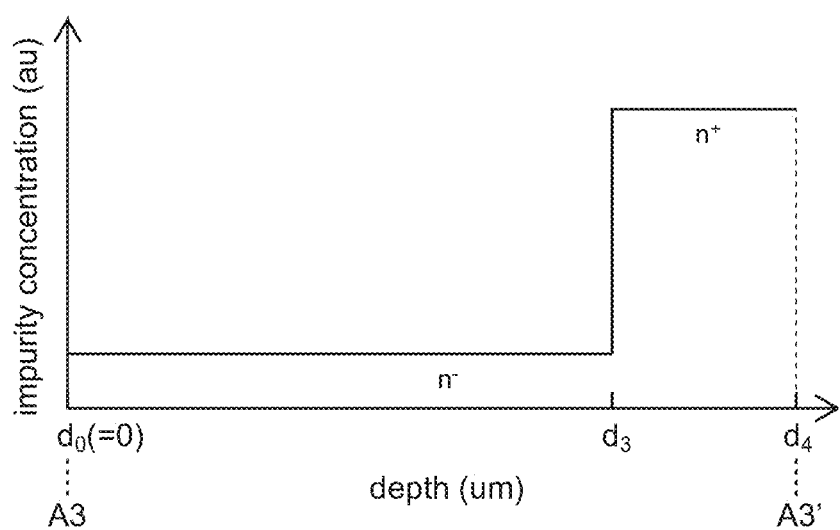

As shown in FIG. 1, the silicon carbide semiconductor device 100 according to the embodiment 1 includes: an $n^+$ type low resistance silicon carbide substrate 110; an $n^-$ type epitaxial layer 112 formed on a surface of the $n^+$ type low resistance silicon carbide substrate 110 on a first main surface side; n type semiconductor regions 114 formed on a surface of the $n^-$ type epitaxial layer 112; p type body regions 116 formed at positions deeper than the n type semiconductor regions 114; $p^-$ type channel regions 118 formed such that each $p^-$ type channel region 118 penetrates the n type semiconductor region 114 from the front surface side of the $n^-$ type epitaxial layer 112, and reaches the p type body region 116; $n^{++}$ type source regions 120 formed toward the p type body region from the front surface side of the $n^-$ type epitaxial layer 112; $p^{++}$ type body contact regions 122 formed such that each $p^{++}$ type body contact region 122 penetrates the n type semiconductor region 114 from the front surface side of the $n^-$ type epitaxial layer 112 and reaches the p type body region 116; and gate electrodes 126 each of which is formed on at least the $p^-$ type channel region 118 with a gate insulating film 124 interposed therebetween. In the silicon carbide semiconductor device 100 according to the embodiment 1, the $p^-$ type channel regions 118 and the $n^{++}$ type source regions 120 are formed at a planar position where the n type semiconductor region 114 remains between the $p^-$ type channel region 118 and the $n^{++}$ type source region 120, and out of boundary surfaces which are formed between the $p^-$ type channel region 118 and the n type semiconductor regions 114, the boundary surface on an outer peripheral side is positioned inside an outer peripheral surface of the p type body region 116 as viewed in a plan view.

In this embodiment, the $n^-$ type epitaxial layer 112 corresponds to an epitaxial layer of a first conductive type of the present invention, the n type semiconductor region 114 corresponds to a first semiconductor region of a first conductive type of the present invention, the p type body region 116 corresponds to a body region of a second conductive type of the present invention, the $p^-$ type channel region 118 corresponds to a channel region of a second conductive type of the present invention, the $n^{++}$ type source region corresponds to a second semiconductor region of a first conductive type of the present invention, and the $p^{++}$ type body contact region 122 corresponds to a body contact region of a second conductive type.

In FIG. 1, the silicon carbide semiconductor device 100 is configured such that all of the n type semiconductor regions 114, the p⁻ type channel regions 118, the n⁺⁺ type source regions 120, and the p⁺⁺ type body contact regions 122 have the same depth. However, it is not always necessary for these regions to have the same depth, and these regions may have different depths from each other.

In the silicon carbide semiconductor device 100 according to the embodiment 1, end portions of the gate electrode 126 are positioned on the n type semiconductor regions 114 each of which remains between the p⁻ type channel region 118 and the n⁺⁺ type source region 120 as viewed in a plan view.

In the silicon carbide semiconductor device 100 according to the embodiment 1, as viewed in a plan view, a distance "a" between a boundary surface on an outer peripheral side out of boundary surfaces which are formed between the p⁻ type channel region 118 and the n type semiconductor regions 114 and an outer peripheral surface of the p type body region 116 satisfies the relationship of 0.1 μm≤a≤0.5 μm, for example.

When the distance "a" is extremely small, due to a manufacturing error, there may be a case that a silicon carbide semiconductor device 100 is manufactured where, as viewed in a plan view, a bottom surface of the p⁻ type channel region 118 is brought into contact with the n type semiconductor region 114 or the n⁻ type epitaxial layer 112. As a result, there is a concern that a threshold value of the transistor changes or punch-through occurs. On the other hand, when the distance "a" is excessively large, the number of channels which can be formed for a unit length in left and right directions in FIG. 1 is reduced and hence, an ON resistance is increased.

In FIG. 1, numeral 128 indicates interlayer insulation films, numeral 130 indicates a source electrode, and numeral 132 indicates a drain electrode. In this specification, with respect to the n⁺ type low resistance silicon carbide substrate 110 and the n⁻ type epitaxial layer 112, a main surface on a side where the n⁻ type epitaxial layer 112 is formed is referred to as a first main surface, and a main surface on a side opposite to the first main surface is referred to as a second main surface.

The n⁺ type low resistance silicon carbide substrate 110 is a low resistance silicon carbide substrate formed using an n⁺ type semiconductor doped with approximately 1 to 10×10¹⁶ cm⁻³ of nitrogen as an impurity, for example. As is well known, various kinds of silicon carbides (SiC) exist such as 2H, 3C, 4H, 6H, 8H, 10H and 15R. These silicon carbides have different crystal structures respectively depending on the arrangement of C atoms and Si atoms. However, silicon carbide having any crystal structure can be used as a material for forming the n⁺ type low resistance silicon carbide substrate 110.

A thickness of the n⁻ type epitaxial layer 112 is approximately 5 to 15 μm, for example. An impurity concentration of the n⁻ type epitaxial layer 112 is approximately 0.5 to 1.5×10¹⁶ cm⁻³, for example.

A depth of the n type semiconductor region 114 is approximately 0.4 to 0.8 μm, for example. An impurity concentration of the n type semiconductor region 114 is approximately 2 to 3×10¹⁶ cm⁻³, for example. The n type semiconductor regions 114 are formed by implanting n type impurity ions (N ions, for example) from a surface of the n⁻ type epitaxial layer 112 on a first main surface side.

A depth of a shallowest portion of the p type body region 116 is approximately 0.05 to 0.5 μm, for example, and a depth of a deepest portion of the p type body region 116 is approximately 1.0 to 2.0 μm, for example. The depth position in the p type body region 116 where the impurity concentration is highest is the depth position of 0.6 to 0.9 μm, for example. The impurity concentration in a portion of the p type body region 116 at such a position is approximately 2×10¹⁷ to 1×10¹⁹ cm⁻³, for example. The p type body regions 116 are formed by implanting p type impurity ions (Al ions, for example) into the n⁻ type epitaxial layer 112 from the front surface of the n⁻ type epitaxial layer 112 on a first main surface side.

A depth of the p⁻ type channel region 118 is approximately 0.2 to 0.5 μm (excluding a depth of the p⁻ type channel region 118 which does not reach the p type body region 116), for example. An impurity concentration of the p⁻ type channel region 118 is approximately 0.5 to 5×10¹⁷ cm⁻³, for example. The p⁻ type channel regions 118 are formed by implanting p type impurity ions (Al ions, for example) from the surface of the n⁻ type epitaxial layer 112 on a first main surface side.

A depth of the n⁺⁺ type source region 120 is approximately 0.2 to 0.6 μm, for example. An impurity concentration of the n⁺⁺ type source region 120 is approximately 1 to 50×10¹⁹ cm⁻³, for example. The n⁺⁺ type source regions 120 are formed by implanting n type impurity ions (P ions, for example) from the surface of the n⁻ type epitaxial layer 112 on a first main surface side.

A depth of the p⁺⁺ type body contact region 122 is approximately 0.2 to 0.6 μm (excluding a depth of the p⁺⁺ type body contact region 122 which does not reach the p type body region 116), for example. An impurity concentration of the p⁺⁺ type body contact region 122 is approximately 1 to 50×10¹⁹ cm⁻³, for example. The p⁺⁺ type body contact regions 122 are formed by implanting p type impurity ions (Al ions, for example) from the surface of the n⁻ type epitaxial layer 112 on a first main surface side.

In the silicon carbide semiconductor device 100 according to the embodiment 1, a length along a lateral direction on a surface of a paper on which the silicon carbide semiconductor device 100 is drawn (channel length) of each p⁻ type channel region 118 is approximately 0.5 to 1.0 μm, for example. Further, a distance between the p⁻ type channel region 118 and the n⁺⁺ type source region 120 is approximately 0.1 to 0.3 μm, for example.

2. Method of Manufacturing a Silicon Carbide Semiconductor Device According to Embodiment 1

The silicon carbide semiconductor device 100 according to the embodiment 1 can be manufactured by a manufacturing method (a method of manufacturing a silicon carbide semiconductor device according to the embodiment 1) described hereinafter.

Hereinafter, the method of manufacturing a silicon carbide semiconductor device according to the embodiment 1 is described with reference to FIG. 2 to FIG. 9 in the order of steps. In FIG. 2B, FIG. 3B, FIG. 4B and FIG. 5B, a depth measured from a first main surface which forms a reference surface is taken on an axis of abscissa. Symbol do indicates a depth of the first main surface, symbol $d_1$ indicates a depth of a bottom portion of the n type semiconductor region 114, symbol $d_2$ indicates a depth of a bottom portion of the p type body region 116, symbol $d_3$ indicates a depth of a boundary surface between the n⁻ type epitaxial layer 112 an the n⁺ type low resistance silicon carbide substrate 110, and symbol $d_4$ indicates a depth of a second main surface.

1. Silicon Carbide Semiconductor Substrate Preparation Step

Firstly, a silicon carbide semiconductor substrate is prepared. The silicon carbide semiconductor substrate includes an n⁺ type low resistance silicon carbide substrate 110, and an n⁻ type epitaxial layer 112 formed on a surface of the n⁺ type low resistance silicon carbide substrate 110 on a first main surface side (see FIG. 2).

2. p Type Body Region Forming Step

Figure 3A:
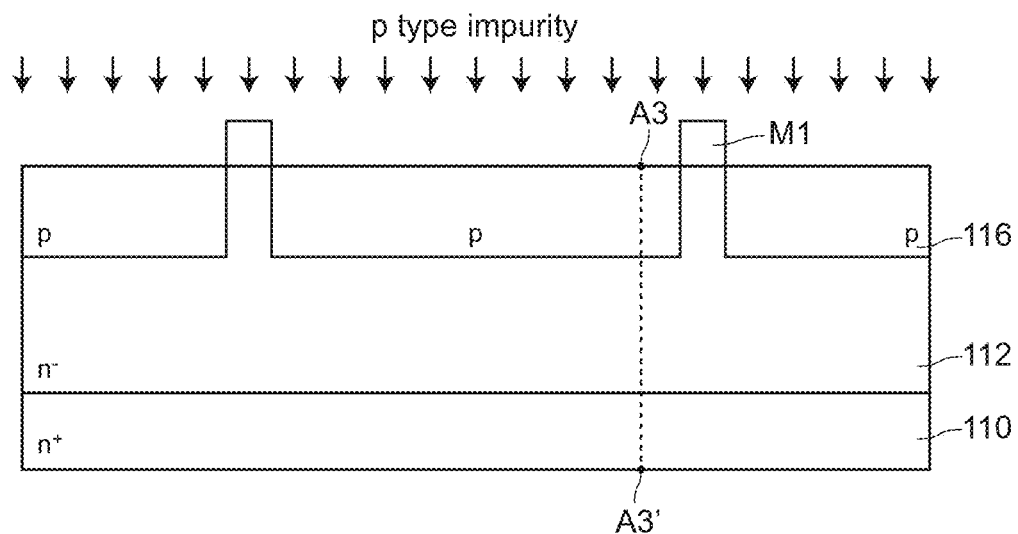
FIG. 3A and FIG. 3B are views for describing a step of manufacturing the silicon carbide semiconductor device 100 according to the embodiment 1.
Figure 3B:
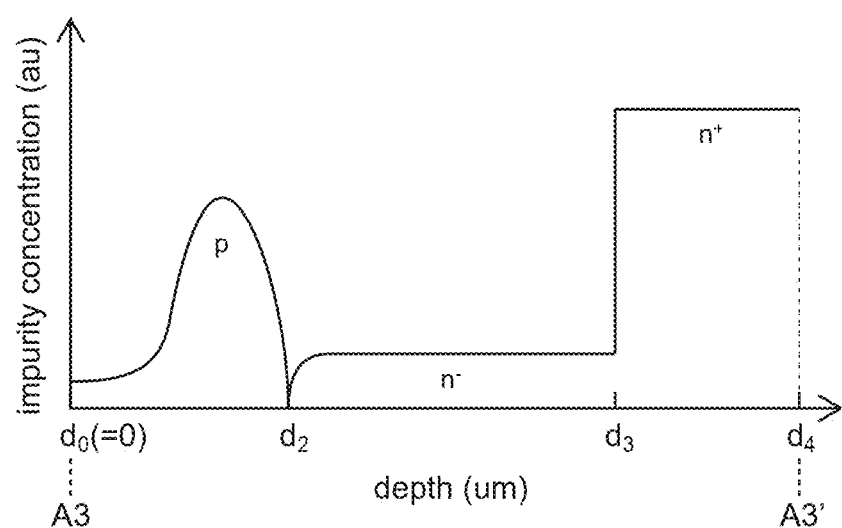

Next, a predetermined mask M1 is formed on a surface of the n⁻ type epitaxial layer 112 and, thereafter, Al ions are implanted into the n⁻ type epitaxial layer 112 through the mask M1 thus forming p type body regions 116 (see FIG. 3A). At this stage of operation, the p type body regions 116 are formed on the surface of the n⁻ type epitaxial layer 112 such that a depth position where a p type impurity exhibits the maximum concentration becomes deeper than the depth position which is a bottom surface of a p⁻ type channel region 118 (to be more specific, the depth position of 0.6 to 0.9 μm, for example) (see FIG. 3B).

3. n Type Semiconductor Region Forming Step

Figure 4A:
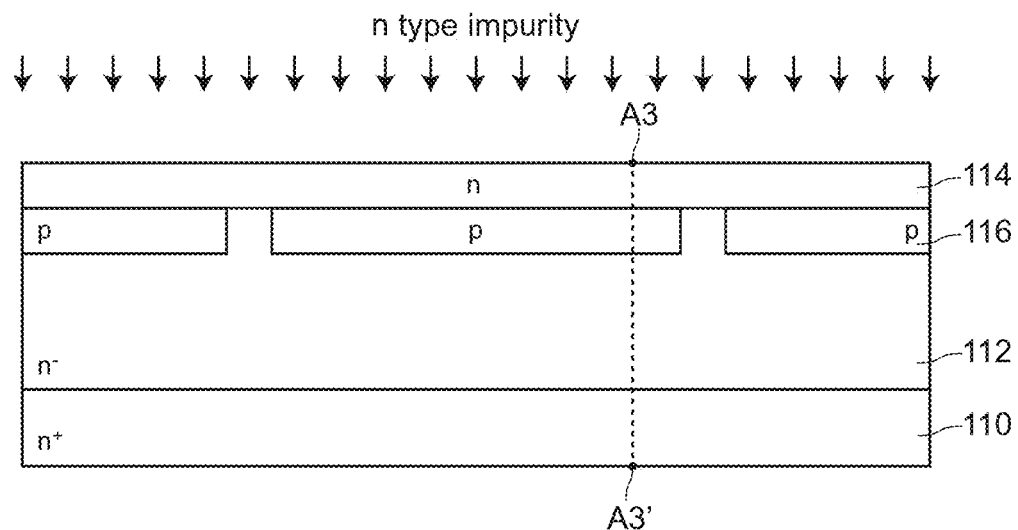
FIG. 4A and FIG. 4B are views for describing a step of manufacturing the silicon carbide semiconductor device 100 according to the embodiment 1.
Figure 4B:
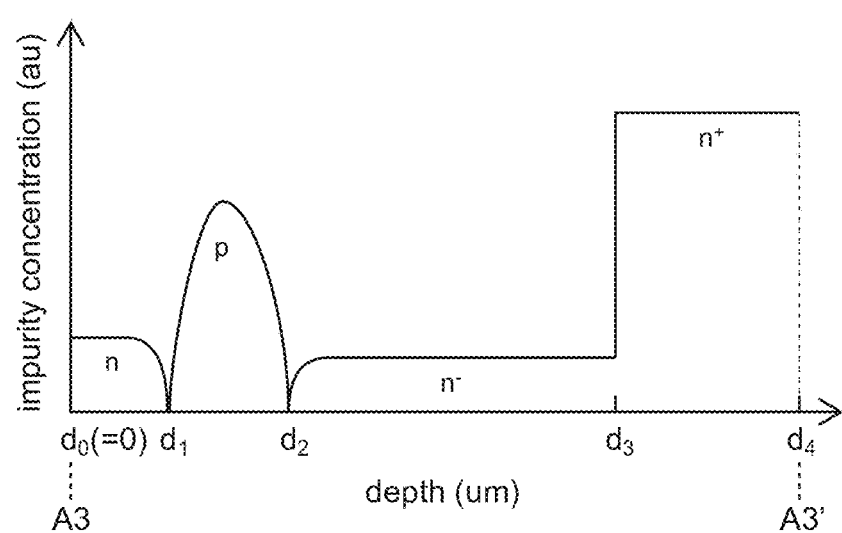

Next, after the mask M1 is removed, n type impurity ions are implanted into the surface of the n⁻ type epitaxial layer 112 thus forming an n type semiconductor region 114 on the front surface of the n⁻ type epitaxial layer 112 (see FIG. 4A). At this stage of operation, ion implantation is performed under a condition where a concentration of n type impurity is higher than a concentration of p type impurity in the n type semiconductor region 114 (see FIG. 4B). The n type semiconductor region 114 is formed over a whole region of an active region in the silicon carbide semiconductor device 100.

4. Step for Forming p⁻ Type Channel Regions and the Like

Next, a p⁻ type channel region forming step where p⁻ type channel regions 118 are formed in the n type semiconductor region 114 (see FIG. 5), a p⁺⁺ type body contact region forming step where p⁺⁺ type body contact regions 122 are formed in the n type semiconductor region 114 (see FIG. 6), and an n⁺⁺ type semiconductor region forming step where n⁺⁺ type source regions 120 are formed in the n type semiconductor region 114 (see FIG. 7) are performed in this order.

(1) p⁻ Type Channel Region Forming Step

Figure 5A:
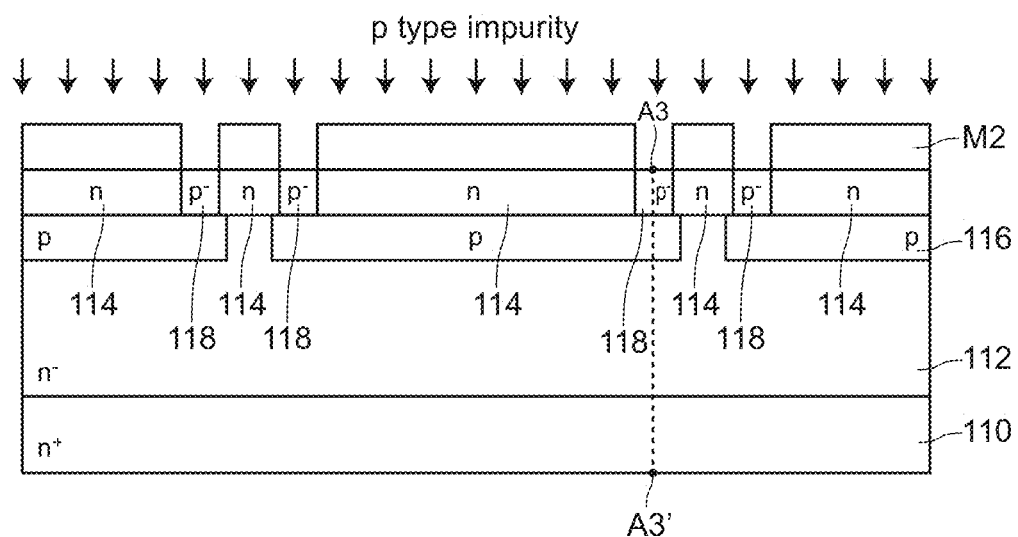
FIG. 5A and FIG. 5B are views for describing a step of manufacturing the silicon carbide semiconductor device 100 according to the embodiment 1.
Figure 5B:
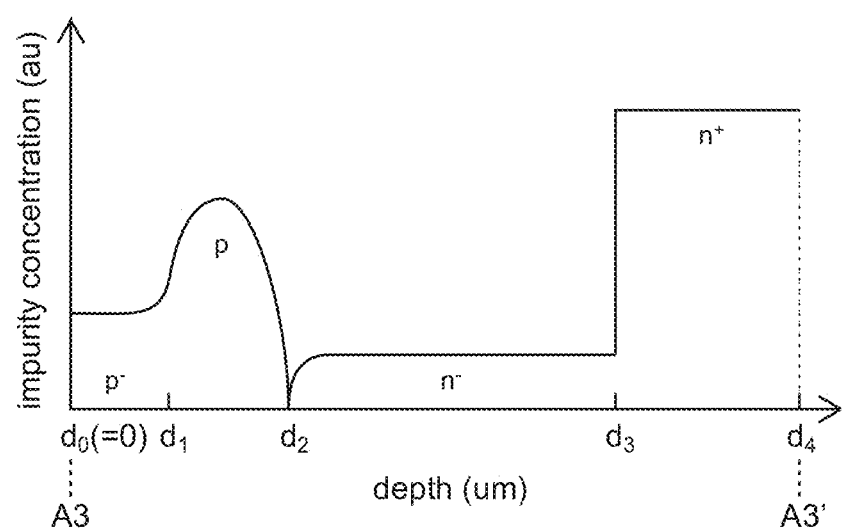

Firstly, a predetermined mask M2 is formed on the surface of the n⁻ type epitaxial layer 112 and, thereafter, p type impurity ions (Al ions, for example) are implanted into the n⁻ type epitaxial layer 112 through the mask M2 thus forming the p⁻ type channel regions 118 in the n type semiconductor region 114 (see FIG. 5A). At this stage of operation, the p⁻ type channel regions 118 are formed in the n type semiconductor region 114 such that the p⁻ type channel regions 118 penetrate the n type semiconductor region 114 and reach the p type body regions 116 (see FIG. 5B). Further, p⁻ type channel regions 118 are formed at a planar position where out of boundary surfaces which are formed between the p⁻ type channel region 118 and the n type semiconductor regions 114, the boundary surface on an outer peripheral side is positioned inside an outer peripheral surface of the p type body region 116 as viewed in a plan view.

(2) p⁺⁺ Type Body Contact Region Forming Step

Figure 6:
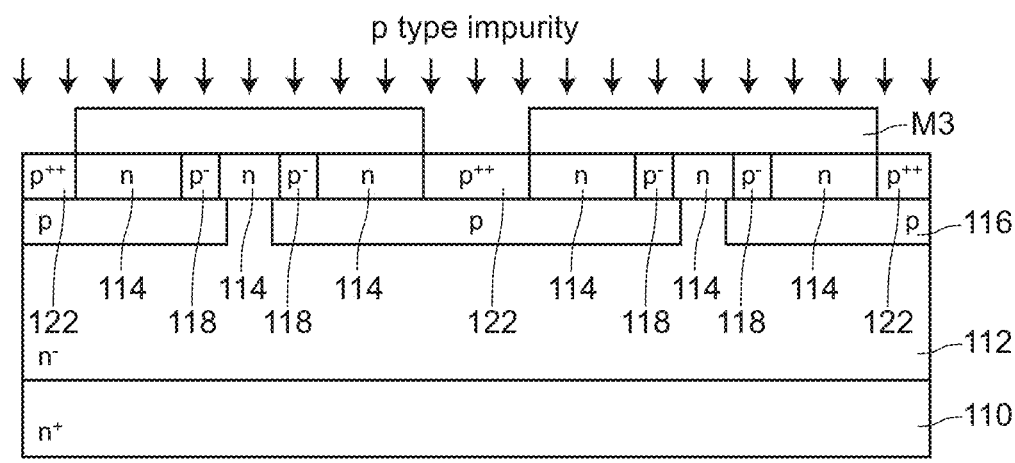
FIG. 6 is a cross-sectional view of the main part showing a step of manufacturing the silicon carbide semiconductor device 100 according to the embodiment 1.

Next, after the mask M2 is removed, a predetermined mask M3 is formed on a surface of the n⁻ type epitaxial layer 112 and, thereafter, p type impurity ions (Al ions, for example) are implanted into the n⁻ type epitaxial layer 112 through the mask M3 thus forming p⁺⁺ type body contact regions 122 in the n type semiconductor region 114 (see FIG. 6). At this stage of operation, the p⁺⁺ type body contact regions 122 are formed in the n type semiconductor region 114 such that the p⁺⁺ type body contact regions 122 penetrate the n type semiconductor region 114 and reach the p type body regions 116.

(3) n⁺⁺ Type Semiconductor Region Forming Step

Figure 7:
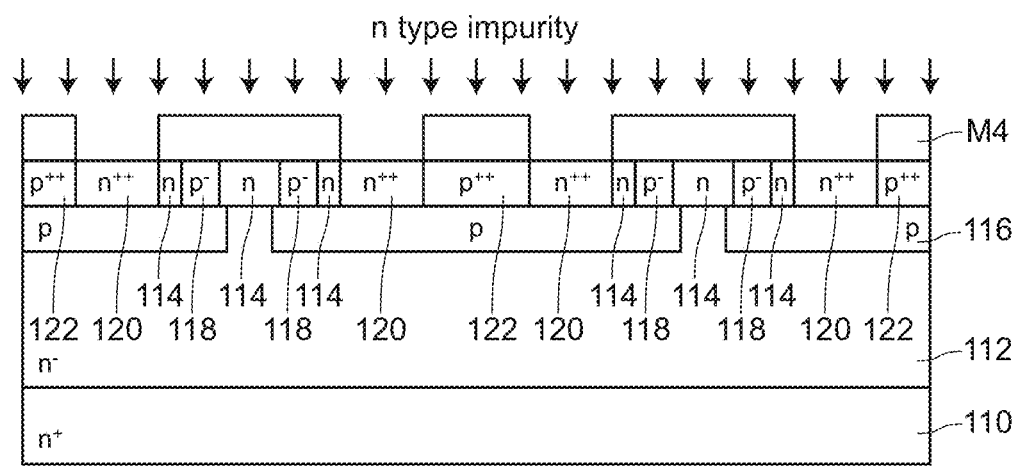
FIG. 7 is a cross-sectional view of the main part showing a step of manufacturing the silicon carbide semiconductor device 100 according to the embodiment 1.

Next, after the mask M3 is removed, a predetermined mask M4 is formed on a surface of the n⁻ type epitaxial layer 112 and, thereafter, n type impurity ions are implanted into the n⁻ type epitaxial layer 112 through the mask M4 thus forming n⁺⁺ type source regions 120 in the n type semiconductor region 114 (see FIG. 7). At this stage of operation, the n⁺⁺ type source regions 120 are formed in the n type semiconductor region 114 such that the n⁺⁺ type source regions 120 penetrate the n type semiconductor region 114 and reach the n type semiconductor region 114. Further, the n⁺⁺ type source regions 120 are formed at a planar position where the n type semiconductor region 114 remains between the p⁻ type channel region 118 and the n⁺⁺ type source region 120. The n⁺⁺ type source regions 120 may be formed such that the n⁺⁺ type source regions 120 do not reach the p type body regions 116.

5. Gate Electrode Forming Step

Figure 8:
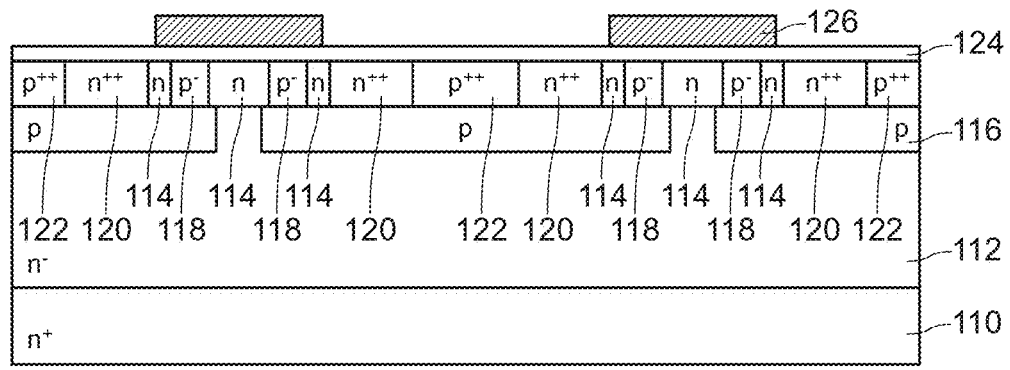
FIG. 8 is a cross-sectional view of the main part showing a step of manufacturing the silicon carbide semiconductor device 100 according to the embodiment 1.

Next, the mask M4 is removed and activation annealing is applied to the substrate and, thereafter, gate electrodes 126 are formed at least on the p⁻ type channel regions 118 with a gate insulating film 124 interposed therebetween (see FIG. 8).

6. Source Electrode and Drain Electrode Forming Step

Figure 9:
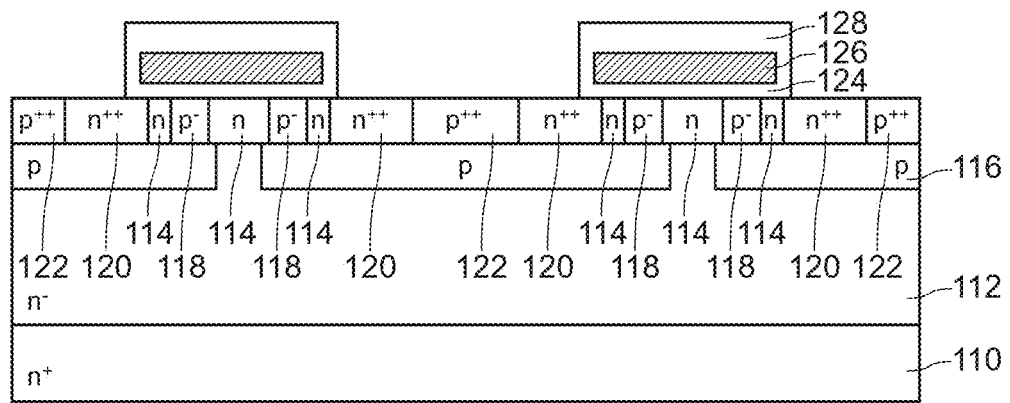
FIG. 9 is a cross-sectional view of the main part showing a step of manufacturing the silicon carbide semiconductor device 100 according to the embodiment 1.

Next, interlayer insulation films 128 are formed such that the interlayer insulation film 128 covers the gate electrode 126 and, at the same time, at least a portion of the n⁺⁺ type source region 120 and a portion of the p⁺⁺ type body contact region 122 are exposed (see FIG. 9). Thereafter, a source electrode 130 is formed such that the source electrode 130 covers the n⁻ type epitaxial layer 112 and the interlayer insulation films 128 and, at the same time, is brought into ohmic contact with the n⁺⁺ type source regions 120 and the p⁺⁺ type body contact regions 122. Further, a drain electrode 132 is formed on a surface (back surface) of the n⁺ type low resistance silicon carbide substrate 110 such that the drain electrode 132 is brought into ohmic contact with the n⁺ type low resistance silicon carbide substrate 110 (see FIG. 1).

By performing the above-mentioned steps, the silicon carbide semiconductor device 100 according to the embodiment 1 can be manufactured.

It is not always necessary to perform the p type body region forming step, the n type semiconductor region forming step, and the step of forming the p⁻ type channel regions and the like in the above-mentioned order. However, when there is a possibility that implanted ions interfere with each other, the design of the method of manufacturing the silicon carbide semiconductor device 100 is facilitated by performing the steps in the above-mentioned order. It is also not always necessary to perform the p⁻ type channel region forming step, the p⁺⁺ type body contact region forming step and the n⁺⁺ type semiconductor region forming step included in the step of forming the p⁻ type channel regions and the like in the above-mentioned order.

3. Advantageous Effects Acquired by Silicon Carbide Semiconductor Device and Method of Manufacturing Silicon Carbide Semiconductor Device According to Embodiment 1

According to the silicon carbide semiconductor device 100 and the method of manufacturing the silicon carbide semiconductor device 100 of the embodiment 1, unlike the third method described previously as one of the conventional methods, the channel regions can be formed by performing the masking step once and hence, it is possible to overcome the drawback of the conventional method that it is difficult to accurately define a channel length due to an error in mask alignment. Further, according to the silicon carbide semiconductor device 100 and the method of manufacturing the silicon carbide semiconductor device 100 of the embodiment 1, a predetermined channel length can be defined without making use of a double diffusion method and side walls adopted by the first method and second method described previously as the conventional methods and hence, a channel length sufficiently long for preventing the occurrence of a short channel effect can be accurately defined in a practical process.

Further, according to the silicon carbide semiconductor device 100 and the method of manufacturing the silicon carbide semiconductor device 100 of the embodiment 1, out of boundary surfaces which are formed between the p$^-$ type channel region 118 and the n type first semiconductor regions 114, the boundary surface on an outer peripheral side is positioned inside an outer peripheral surface 116a of the p type body region 116 as viewed in a plan view and hence, the whole bottom surface of the p$^-$ type channel region 118 is covered by the p type body region 116. Accordingly, there is no possibility that the depletion layer extends to the surface of the p$^-$ type channel region 118 of the p$^-$ type channel region 118 from the bottom surface of the p$^-$ type channel region 118 and hence, a drawback such as a change in a threshold value of a transistor or the occurrence of a punch-through minimally takes place.

Further, according to the silicon carbide semiconductor device 100 and the method of manufacturing the silicon carbide semiconductor device 100 of the embodiment 1, the p$^-$ type channel regions 118 and the n$^{++}$ type source regions 120 are formed at a planar position where the n type semiconductor region 114 remains between the p$^-$ type channel region 118 and the n$^{++}$ type source region 120 and hence, in the p$^-$ type channel region forming step, portions of the n type semiconductor region 114 into which p type impurity ions are implanted are formed into the p$^-$ type channel regions 118 with certainty so that channel regions can be formed by performing a masking step once.

Further, according to the silicon carbide semiconductor device 100 and the method of manufacturing the silicon carbide semiconductor device 100 of the embodiment 1, the end portions of the gate electrode 126 are positioned on the n type semiconductor regions 114 each of which remains between the p$^-$ type channel region 118 and the n$^{++}$ type source region 120 as viewed in a plan view. Accordingly, even if a slight positional displacement occurs at the end portions of the gate electrode 126 at the time of forming the gate electrodes 126, the gate electrode 126 covers the channel regions with certainty. Accordingly, a channel length is always maintained at a fixed value and hence, it is possible to accurately define a desired channel length.

Further, according to the silicon carbide semiconductor device 100 and the method of manufacturing the silicon carbide semiconductor device 100 of the embodiment 1, n type impurities are introduced into a JFET region disposed directly below the gate electrode 126 so that a resistance in the JFET region is lowered and hence, it is also possible to acquire an advantageous effect that an ON resistance can be lowered.

In the silicon carbide semiconductor device 100 according to the embodiment 1, "the n$^{++}$ type source regions 120" and "the n type semiconductor regions 114 each of which remains between the n$^{++}$ type source region 120 and the p$^-$ type channel region 118" form a source region of the power MOSFET.

Embodiment 2

A silicon carbide semiconductor device 102 according to an embodiment 2 is a silicon carbide semiconductor device according to the first mode of the present invention. The silicon carbide semiconductor device 102 according to the embodiment 2 is a power MOSFET.

Figure 10:
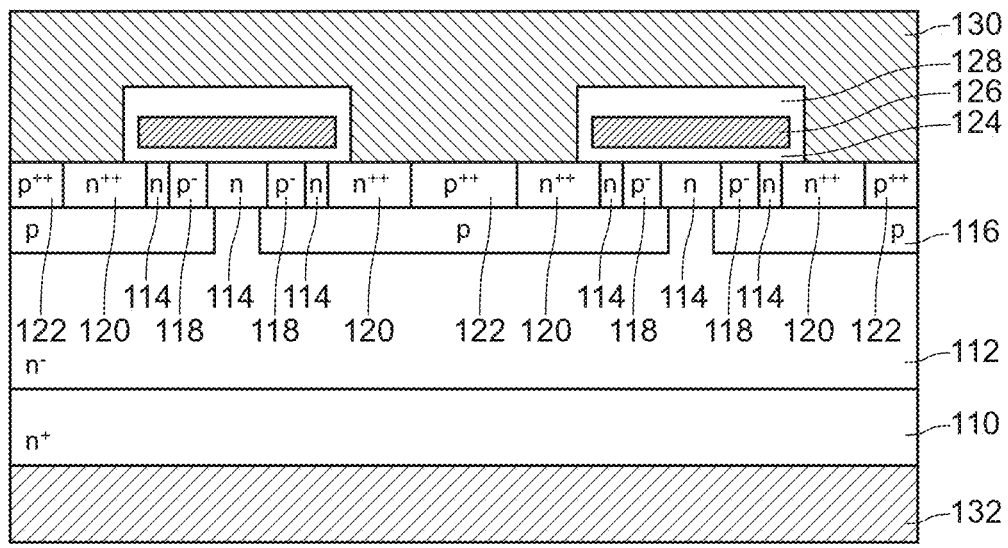
FIG. 10 is a cross-sectional view of a main part of a silicon carbide semiconductor device 102 according to an embodiment 2.

The silicon carbide semiconductor device 102 according to the embodiment 2 basically has substantially the same configuration as the silicon carbide semiconductor device 100 according to the embodiment 1. However, the silicon carbide semiconductor device 102 according to the embodiment 2 differs from the silicon carbide semiconductor device 100 according to the embodiment 1 with respect to a planar position of end portions of each gate electrode. That is, in the silicon carbide semiconductor device 102 according to the embodiment 2, as shown in FIG. 10, end portions of each gate electrode 126 are positioned on n$^{++}$ type source regions 120 as viewed in a plan view.

In this manner, the silicon carbide semiconductor device 102 according to the embodiment 2 differs from the silicon carbide semiconductor device 100 according to the embodiment 1 with respect to the planar position of the end portions of the gate electrode. However, the silicon carbide semiconductor device 102 according to the embodiment 2 includes p$^-$ type channel regions 118 formed in the same manner as the silicon carbide semiconductor device 100 according to the embodiment 1 and hence, a channel length sufficiently long for preventing the occurrence of a short channel effect can be accurately defined in a practical process. Further, a drawback such as a change in a threshold value of a transistor or the occurrence of a punch-through minimally takes place.

According to the silicon carbide semiconductor device 102 of the embodiment 2, the end portions of each gate electrode 126 are positioned on the n$^{++}$ type source regions 120 as viewed in a plan view. Accordingly, in the same manner as the silicon carbide semiconductor device 100 according to the embodiment 1, even if a slight positional displacement occurs at the end portions of the gate electrode 126 at the time of forming the gate electrodes 126, the gate electrode covers the channel regions with certainty. Accordingly, a channel length is always maintained at a fixed value and hence, it is possible to accurately define a desired channel length.

According to the silicon carbide semiconductor device 102 of the embodiment 2, the end portions of each gate electrode 126 are positioned on the n$^{++}$ type source regions 120 as viewed in a plan view. Accordingly, compared to the case of the silicon carbide semiconductor device 100 of the embodiment 1, a channel can be formed over the whole surfaces of the p$^-$ type channel regions 118 with certainty. Further, a surface of the n type semiconductor region 114 is brought into an accumulation state and hence, a resistance is reduced. Accordingly, an ON resistance is reduced compared to the silicon carbide semiconductor device 100 of the embodiment 1.

In the case where the semiconductor device is a silicon carbide semiconductor device, even when a surface of then type semiconductor region 114 is brought into an accumulation state, the n$^{++}$ type source region 120 has a lower resistance than the semiconductor region 114 in general. Accordingly, it is desirable to arrange the n$^{++}$ type source region 120 and the p$^-$ type channel region 118 as close as possible while leaving the n type semiconductor region 114 between the n$^{++}$ type source region 120 and the p$^-$ type channel region 118 with certainty even when a manufacturing error occurs. With such a configuration, an ON resistance is further reduced.

The silicon carbide semiconductor device 102 according to the embodiment 2 has substantially the same configuration as the silicon carbide semiconductor device 100 according to the embodiment 1 except for the planar position of the end portions of the gate electrode. Accordingly, the silicon carbide semiconductor device 102 of the embodiment 2 can acquire advantageous effects which are brought about by its configurations which correspond to the configurations of the silicon carbide semiconductor device 100 of the embodiment 1 out of the advantageous effects which the silicon carbide semiconductor device 100 according to the embodiment 1 can acquire.

Embodiment 3

A silicon carbide semiconductor device 104 of an embodiment 3 is a silicon carbide semiconductor device according to the first mode of the present invention. The silicon carbide semiconductor device 104 according to the embodiment 3 is a power MOSFET.

Figure 11:
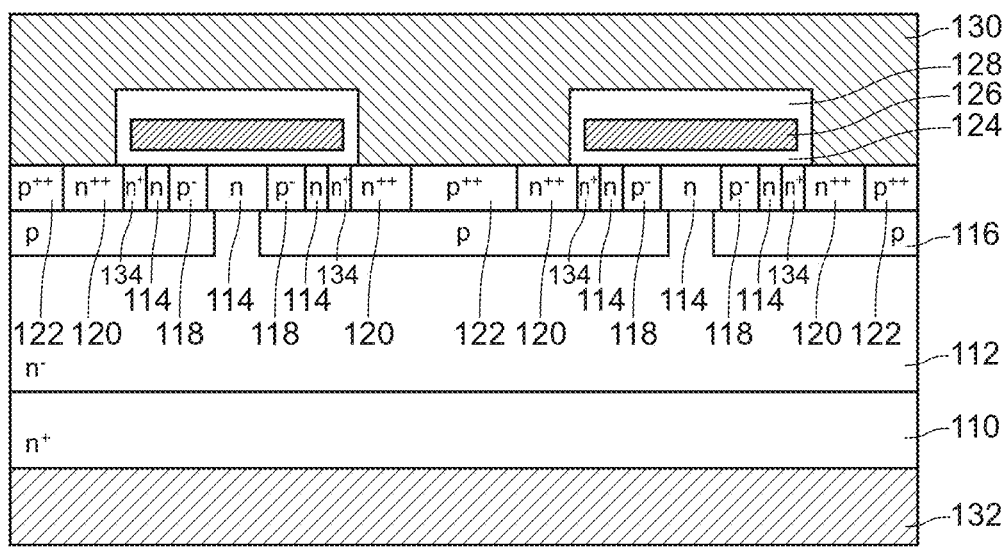
FIG. 11 is a cross-sectional view of a main part of a silicon carbide semiconductor device 104 of an embodiment 3.

The silicon carbide semiconductor device 104 according to the embodiment 3 basically has substantially the same configuration as the silicon carbide semiconductor device 100 according to the embodiment 1. However, the silicon carbide semiconductor device 104 according to the embodiment 3 differs from the silicon carbide semiconductor device 100 according to the embodiment 1 with respect to a planar position of end portions of each gate electrode. That is, in the silicon carbide semiconductor device 104 according to the embodiment 3, as shown in FIG. 11, end portions of each gate electrode 126 are positioned on $n^+$ type semiconductor regions 134 each of which is formed between an $n^{++}$ type source region 120 and an n type semiconductor region 114 as viewed in a plan view. In the embodiment 3, the $n^+$ type semiconductor region 134 corresponds to the third semiconductor region of a first conductive type of the present invention.

A depth of the $n^+$ type semiconductor region 134 is approximately 0.2 to 0.6 μm, for example. An impurity concentration of the $n^+$ type semiconductor region 134 is approximately 0.5 to $10 \times 10^{18}$ $cm^{-3}$, for example. The $n^+$ type semiconductor regions 134 are formed by implanting n type impurity ions (N ions, for example) into $n^-$ type epitaxial layer 112 from a surface of the $n^-$ type epitaxial layer 112 on a first main surface side.

In this manner, the silicon carbide semiconductor device 104 according to the embodiment 3 differs from the silicon carbide semiconductor device 100 according to the embodiment 1 with respect to a planar position of the end portions of the gate electrode. However, the silicon carbide semiconductor device 104 according to the embodiment 3 includes $p^-$ type channel regions 118 formed in the same manner as the silicon carbide semiconductor device 100 according to the embodiment 1 and hence, a channel length sufficiently long for preventing the occurrence of a short channel effect can be accurately defined in a practical process. Further, a drawback such as a change in a threshold value of a transistor or the occurrence of a punch-through minimally takes place.

Further, according to the silicon carbide semiconductor device 104 of the embodiment 3, the end portions of the gate electrode 126 are positioned on the $n^+$ type semiconductor regions 134 each of which is formed between the $n^{++}$ type source region 120 and the n type semiconductor region 114. Accordingly, in the same manner as the silicon carbide semiconductor device 100 of the embodiment 1, even if a slight positional displacement occurs at the end portions of the gate electrode 126 at the time of forming the gate electrodes 126, the gate electrode covers the channel regions with certainty. Accordingly, a channel length is always maintained at a fixed value and hence, it is possible to accurately define a desired channel length.

Further, according to the silicon carbide semiconductor device 104 of the embodiment 3, the end portions of each gate electrode 126 are positioned on the $n^+$ type semiconductor regions 134 each of which is formed between the $n^{++}$ type source region 120 and then type semiconductor region 114. Accordingly, compared to the silicon carbide semiconductor device 102 according to the embodiment 2, it is possible to reduce surface roughness and crystal defects caused in silicon carbide semiconductors which face the gate electrode 126 in an opposed manner and into which ions are implanted and hence, a silicon carbide semiconductor device which is minimally influenced by surface roughness and crystal defects can be acquired. As the influence exerted by surface roughness and crystal defects, the lowering of a gate breakdown voltage or the lowering of reliability can be named, for example.

The silicon carbide semiconductor device 104 according to the embodiment 3 has substantially the same configuration as the silicon carbide semiconductor device 100 according to the embodiment 1 except for the planar position of the end portions of the gate electrode. Accordingly, the silicon carbide semiconductor device 102 of the embodiment 3 can acquire advantageous effects which are brought about by its configurations which correspond to the configurations of the silicon carbide semiconductor device 100 of the embodiment 1 out of the advantageous effects which the silicon carbide semiconductor device 100 according to the embodiment 1 can acquire.

The silicon carbide semiconductor device 104 according to the embodiment 3 differs from the silicon carbide semiconductor device 102 of the embodiment 2 with respect to a point that the end portions of the gate electrode are formed on the $n^+$ type semiconductor regions 134 in the silicon carbide semiconductor device 104 according to the embodiment 3 while the end portions of the gate electrode are formed on the $n^{++}$ type source regions 120 in the silicon carbide semiconductor device 104 according to the embodiment 2. However, in the same manner as the embodiment 2, a surface of then type semiconductor region 114 is brought into an accumulation state and hence, a resistance is reduced. Accordingly, an ON resistance is reduced compared to the silicon carbide semiconductor device 100 of the embodiment 1.

In the case where the semiconductor device is a silicon carbide semiconductor device, even when a surface of then type semiconductor region 114 is brought into an accumulation state, the $n^+$ type semiconductor region 134 has a lower resistance than the semiconductor region 114 in general. Accordingly, it is desirable to arrange the $n^+$ type semiconductor region 134 and the $p^-$ type channel region 118 as close as possible while leaving the n type semiconductor region 114 between $n^+$ type semiconductor region 134 and the $p^-$ type channel region 118 with certainty even when a manufacturing error occurs. With such a configuration, an ON resistance is further reduced.

In the silicon carbide semiconductor device 104 according to the embodiment 3, "the $n^{++}$ type source regions 120", "the $n^+$ type semiconductor regions 134" and "the n type semiconductor regions 114 each of which remains between the $n^+$ type semiconductor region 134 and the $p^-$ type channel region 118" form the source region of the power MOSFET.

Embodiment 4

Figure 12:
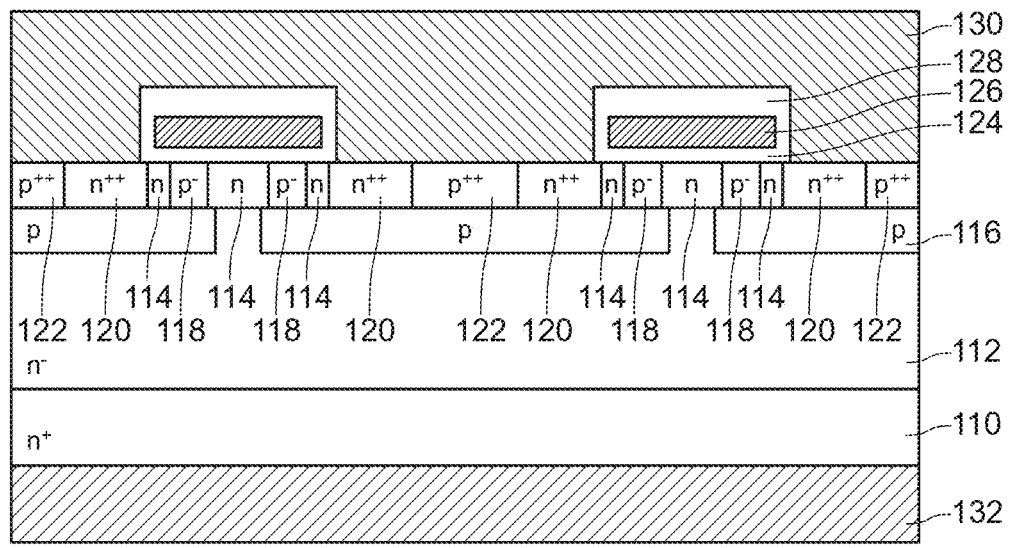
FIG. 12 is a cross-sectional view of a main part of a silicon carbide semiconductor device 106 according to an embodiment 4.

A silicon carbide semiconductor device 106 according to an embodiment 4 is a silicon carbide semiconductor device according to the first mode of the present invention. The silicon carbide semiconductor device 106 according to the embodiment 4 is a power MOSFET. As shown in FIG. 12, the silicon carbide semiconductor device 106 according to the embodiment 4 basically has substantially the same configuration as the silicon carbide semiconductor device 100 according to the embodiment 1.

Figure 13:
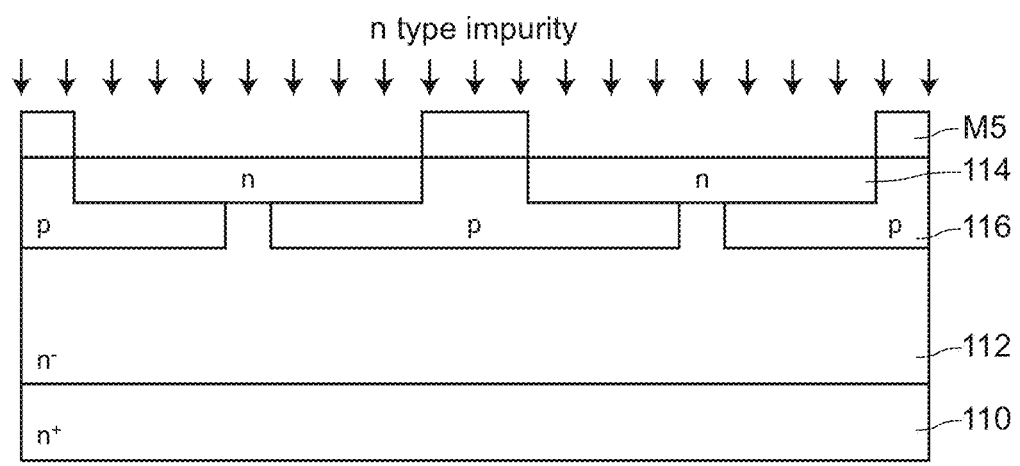
FIG. 13 is a cross-sectional view of the main part showing a step of manufacturing the silicon carbide semiconductor device 106 according to the embodiment 4.

As described above, the silicon carbide semiconductor device 106 according to the embodiment 4 has substantially the same configuration as the silicon carbide semiconductor device 100 according to the embodiment 1. However, as shown in FIG. 13, in a step of manufacturing the silicon carbide semiconductor device according to the embodiment 4 (n type semiconductor region forming step), n type impurity ions are not implanted into portions which correspond to $p^{++}$ type body contact regions 122. Accordingly, the silicon carbide semiconductor device according to the embodiment 4 differs from the silicon carbide semiconductor device 100 according to the embodiment 1 with respect to a point that a silicon carbide semiconductor device to be manufactured is a silicon carbide semiconductor device where n type impurity ions are not implanted into the portions which correspond to the $p^{++}$ type body contact regions 122.

In this manner, the silicon carbide semiconductor device 106 according to the embodiment 4 differs from the silicon carbide semiconductor device 100 according to the embodiment 1 with respect to a point that n type impurity ions are not implanted into the portions which correspond to the $p^{++}$ type body contact regions 122. However, the silicon carbide semiconductor device according to the embodiment 4 includes $p^-$ type channel regions 118 formed in the same manner as the silicon carbide semiconductor device 100 according to the embodiment 1 and hence, a channel length sufficiently long for preventing the occurrence of a short channel effect can be accurately defined in a practical process. Further, a drawback such as a change in a threshold value of a transistor or the occurrence of a punch-through minimally takes place.

Further, according to the silicon carbide semiconductor device 106 according to the embodiment 4, n type impurity ions are not implanted into the portions which correspond to the $p^{++}$ type body contact regions 122 and hence, it is also possible to acquire an advantageous effect that contact resistance between a source electrode 130 and the $p^{++}$ type body contact region can be further reduced.

The silicon carbide semiconductor device 106 according to the embodiment 4 has substantially the same configuration as the silicon carbide semiconductor device 100 according to the embodiment 1 except for that n type impurity ions are not implanted into the portions which correspond to the $p^{++}$ type body contact regions 122. Accordingly, the silicon carbide semiconductor device 106 of the embodiment 4 can acquire advantageous effects which are brought about by its configurations which correspond to the configurations of the silicon carbide semiconductor device 100 of the embodiment 1 out of the advantageous effects which the silicon carbide semiconductor device 100 according to the embodiment 1 can acquire.

In the present invention, n type impurity ions may not be implanted into not only the portions which correspond to the $p^{++}$ type body contact regions 122 but also portions of regions which correspond to the $n^{++}$ type source region 120 disposed adjacently to the $p^{++}$ type body contact regions 122 at the time of forming the n type semiconductor regions 114.

Embodiment 5

A silicon carbide semiconductor device 108 according to an embodiment 5 is a silicon carbide semiconductor device according to the second mode of the present invention. The silicon carbide semiconductor device 108 according to the embodiment 5 is a power MOSFET. The silicon carbide semiconductor device 108 according to the embodiment 5 basically has substantially the same configuration as the silicon carbide semiconductor device 100 according to the embodiment 1.

Figure 14A:
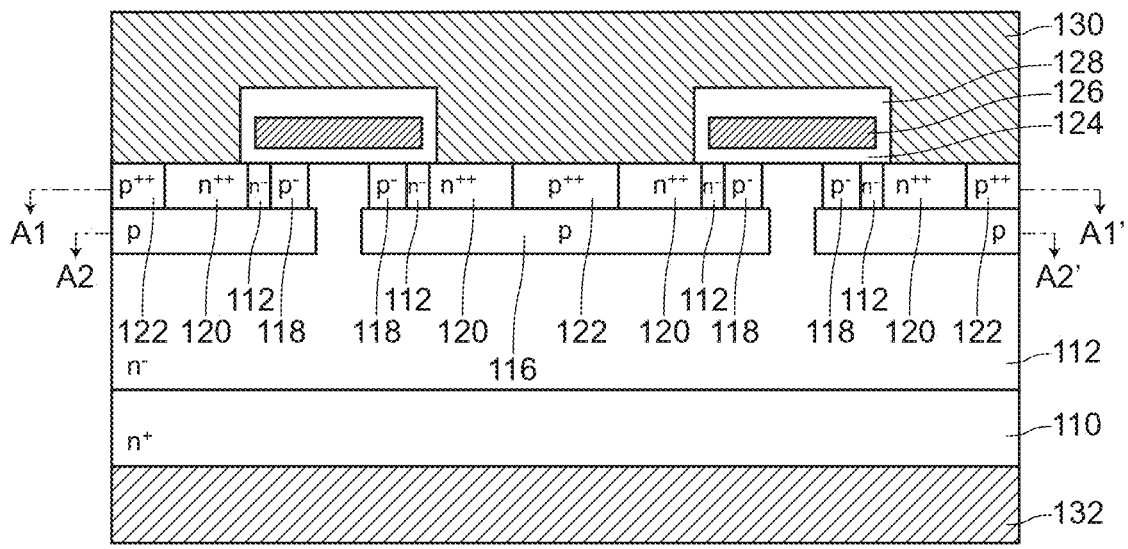
FIG. 14A to FIG. 14C are views for describing a silicon carbide semiconductor device 108 according to an embodiment 5.
Figure 14B:
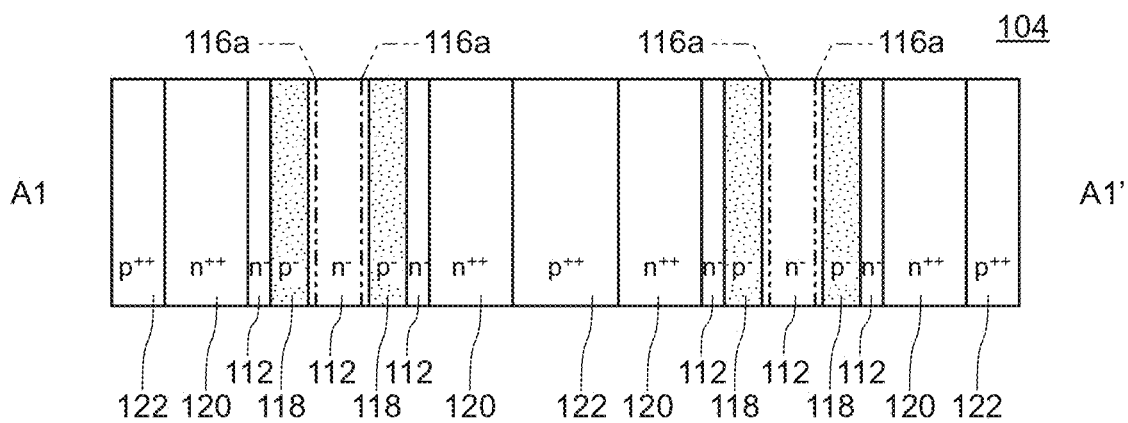
Figure 14C:
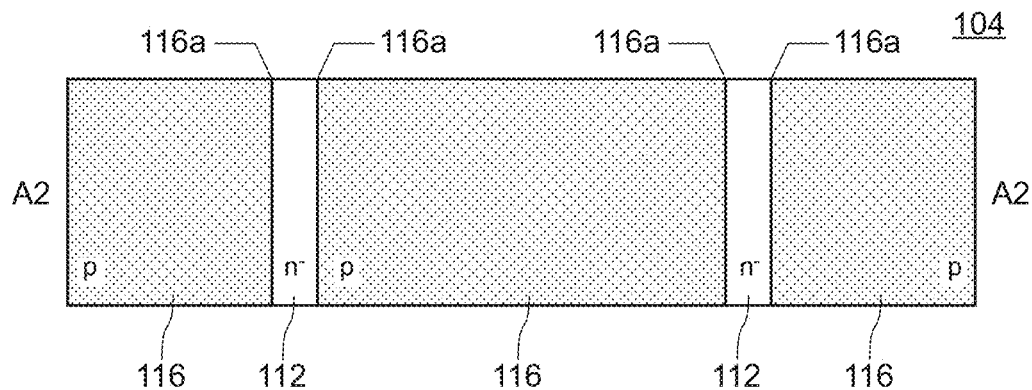

As described above, the silicon carbide semiconductor device 108 according to the embodiment 5 basically has substantially the same configuration as the silicon carbide semiconductor device 100 according to the embodiment 1. However, as shown in FIG. 14A to FIG. 14C, the silicon carbide semiconductor device 108 according to the embodiment 5 differs from the silicon carbide semiconductor device 100 according to the embodiment 1 with respect to a point that the silicon carbide semiconductor device 108 according to the embodiment 5 does not include n type semiconductor regions. That is, in the silicon carbide semiconductor device 108 according to the embodiment 5, "a region which remains between an $n^{++}$ type source region 120 and a $p^-$ type channel region 118" is not "an n type semiconductor region" but is "an $n^-$ type epitaxial layer 112".

As shown in FIG. 14A to FIG. 14C, the silicon carbide semiconductor device 108 according to the embodiment 5 includes: an $n^+$ type low resistance silicon carbide substrate 110; an $n^-$ type epitaxial layer 112 formed on a surface of the $n^+$ type low resistance silicon carbide substrate 110 on a first main surface side; p type body regions 116 formed at predetermined depth positions on a surface side of the $n^-$ type epitaxial layer 112; $p^-$ type channel regions 118 formed such that each $p^-$ type channel region 118 reaches the p type body region 116 from the front surface side of the $n^-$ type epitaxial layer 112; $n^{++}$ type source regions 120 each of which is formed toward the p type body region 116 from the front surface side of the $n^-$ type epitaxial layer 112; $p^{++}$ type body contact regions 122 formed such that each $p^{++}$ type body contact region 122 reaches the p type body region 116 from the front surface side of the $n^-$ type epitaxial layer 112; and gate electrodes 126 each of which is formed on at least the $p^-$ type channel regions 118 with a gate insulating film 124 interposed therebetween. The $p^-$ type channel regions 118 and the $n^{++}$ type source regions 120 are formed at a planar position where the $n^-$ type epitaxial layer 112 remains between the $p^-$ type channel region 118 and the $n^{++}$ type source region 120, and out of boundary surfaces which are formed between the $p^-$ type channel region 118 and the $n^-$ type epitaxial layers 112, the boundary surface on an outer peripheral side is positioned inside an outer peripheral surface of the p type body region 116 as viewed in a plan view.

Figure 15A:
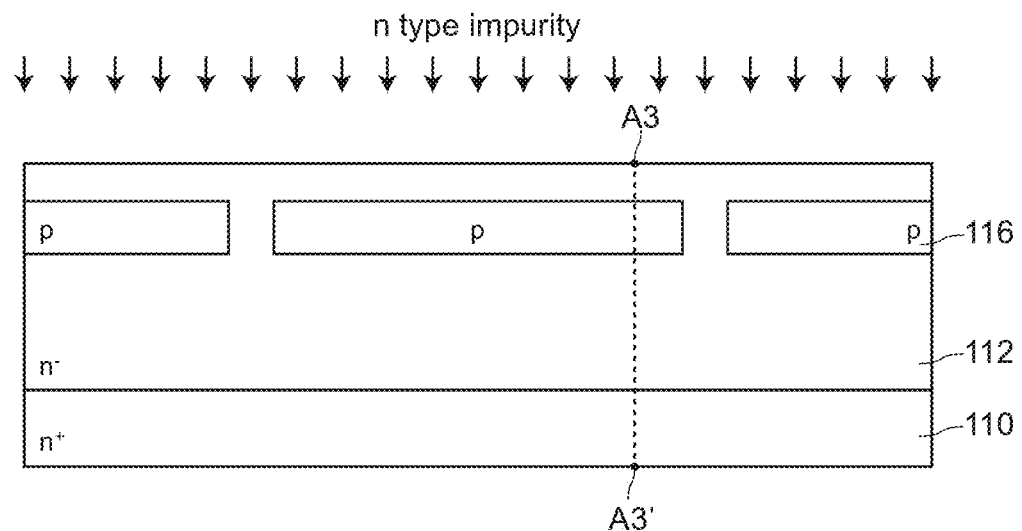
FIG. 15A and FIG. 15B are views for describing a step of manufacturing the silicon carbide semiconductor device 108 according to the embodiment 5.
Figure 15B:
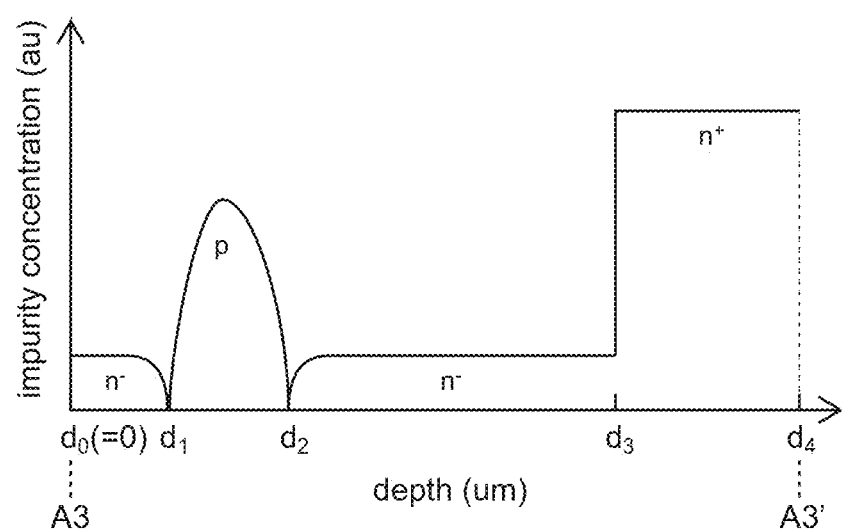
Figure 16A:
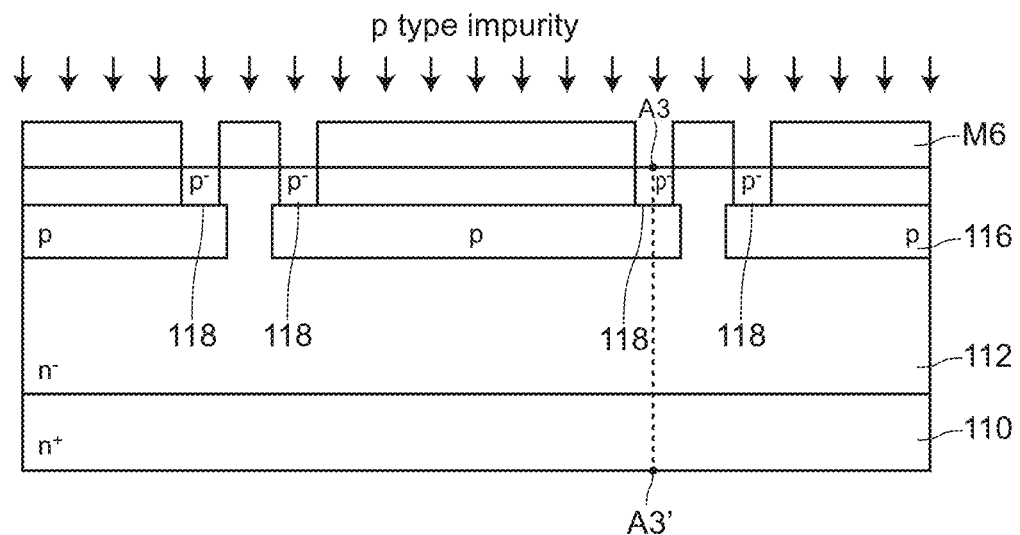
FIG. 16A and FIG. 16B are views for describing a step of manufacturing the silicon carbide semiconductor device 108 according to the embodiment 5.
Figure 16B:
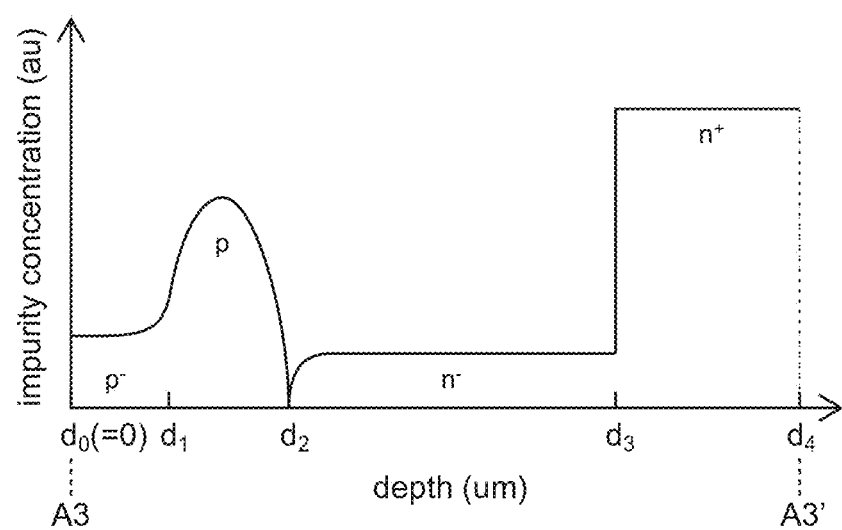

The silicon carbide semiconductor device 108 according to the embodiment 5 can be manufactured by performing substantially the same steps as the method of manufacturing a silicon carbide semiconductor device according to the embodiment 1 except for that, in a p type body region forming step, the p type body regions 116 are formed at predetermined depth regions on a surface of the $n^-$ type epitaxial layer 112 (see FIG. 15), and the $p^-$ type channel regions 118 (see FIG. 16), the $n^{++}$ type source regions 120 and the $p^{++}$ type body contact regions 122 are formed on the surface of the $n^-$ type epitaxial layer 112.

In this manner, the silicon carbide semiconductor device 108 according to the embodiment 5 differs from the silicon carbide semiconductor device 100 according to the embodiment 1 with respect to a point that the silicon carbide semiconductor device 108 according to the embodiment 5 does not include n type semiconductor regions. However, the silicon carbide semiconductor device 108 according to the embodiment 5 includes the p⁻ type channel regions 118 formed in the same manner as the silicon carbide semiconductor device 100 according to the embodiment 1 and hence, a channel length sufficiently long for preventing the occurrence of a short channel effect can be accurately defined in a practical process. Further, a drawback such as a change in a threshold value of a transistor or the occurrence of a punch-through minimally takes place.

Further, according to the silicon carbide semiconductor device of the embodiment 5, it is also possible to acquire an advantageous effect that an n type semiconductor region forming step can be omitted.

The silicon carbide semiconductor device according to the embodiment 5 has substantially the same configuration as the silicon carbide semiconductor device 100 according to the embodiment 1 except for that the silicon carbide semiconductor device according to the embodiment 5 does not include the n type semiconductor regions. Accordingly, the silicon carbide semiconductor device 108 of the embodiment 5 can acquire advantageous effects which are brought about by its configurations which correspond to the configurations of the silicon carbide semiconductor device 100 of the embodiment 1 out of the advantageous effects which the silicon carbide semiconductor device 100 according to the embodiment 1 can acquire.

Embodiment 6

Figure 17:
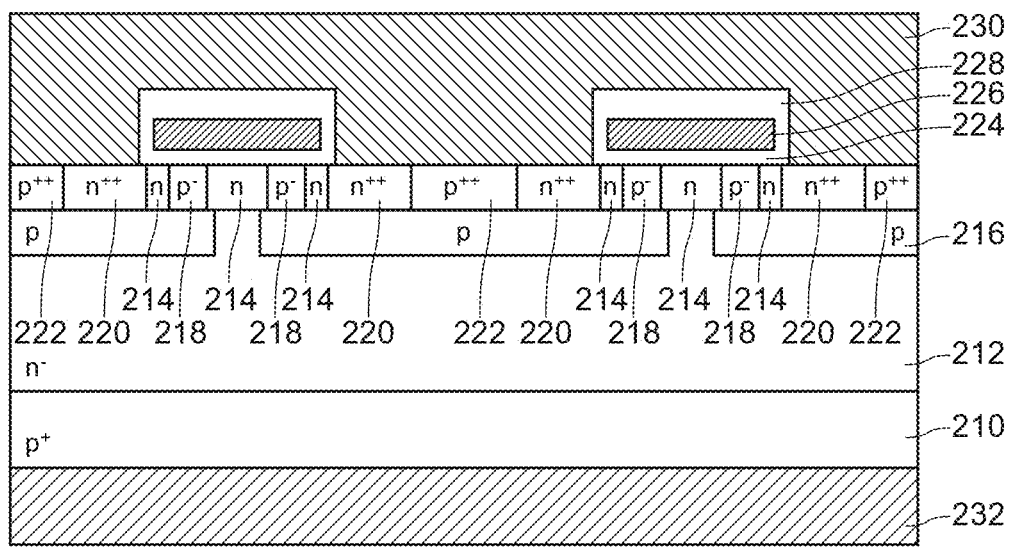
FIG. 17 is a cross-sectional view of a main part of a silicon carbide semiconductor device 200 according to an embodiment 6.
Figure 18:
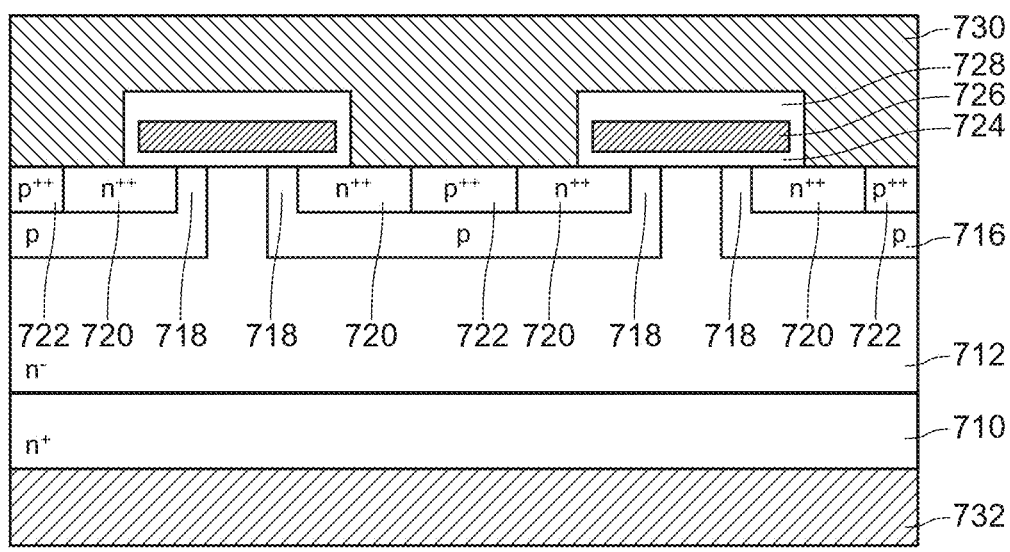
FIG. 18 is a cross-sectional view of a main part of a conventional silicon carbide semiconductor device 700.
Figure 19:
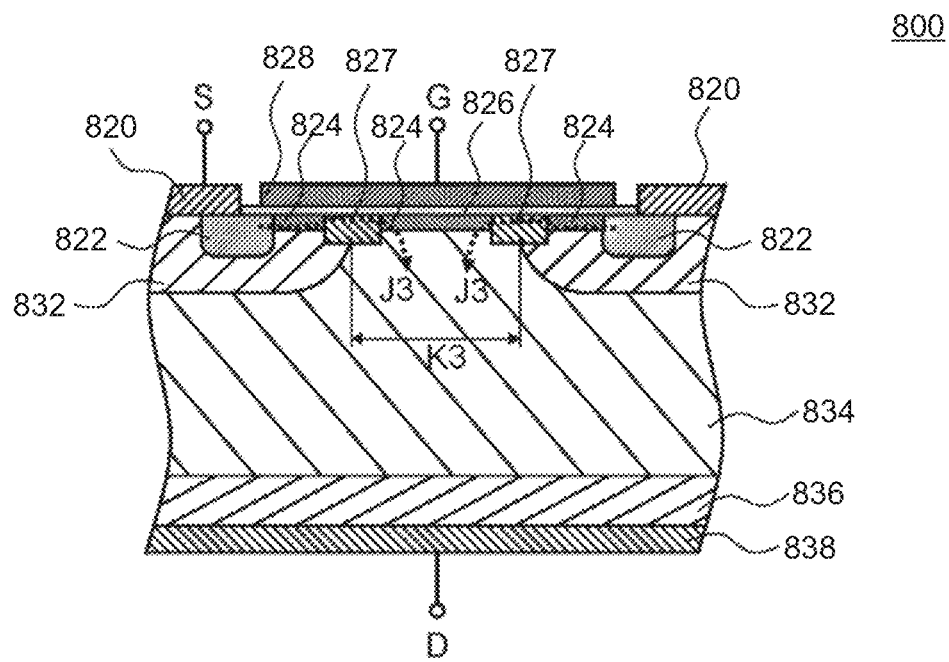
FIG. 19 is a cross-sectional view of a main part of a silicon carbide semiconductor device 800 described in JP-A-2007-13058.
Figure 20:
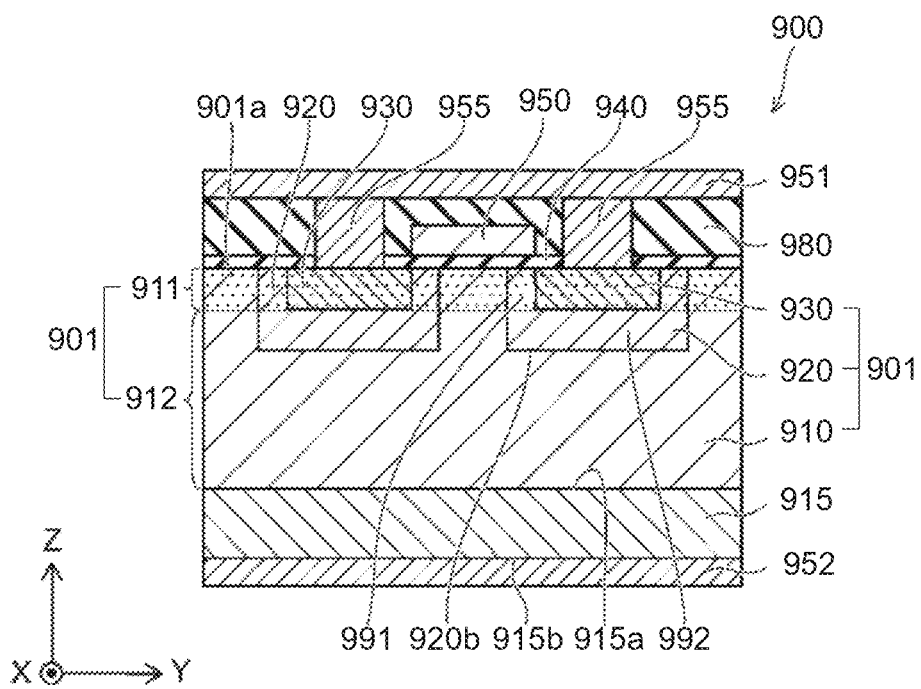
FIG. 20 is a cross-sectional view of a main part of a silicon carbide semiconductor device 900 described in JP-A-2014-29952.

A silicon carbide semiconductor device 200 according to the embodiment 6 is a silicon carbide semiconductor device according to the first mode of the present invention. The silicon carbide semiconductor device 200 according to the embodiment 6 is an IGBT. FIG. 17 is a cross-sectional view of a main part of the silicon carbide semiconductor device 200 according to the embodiment 6. In FIG. 17, numeral 210 indicates a p⁺ type low resistance silicon carbide substrate, numeral 212 indicates an n⁻ type epitaxial layer, numeral 214 indicates n type semiconductor regions, numerals 216 indicates p type body regions, numeral 218 indicates p⁻ type channel regions, numeral 220 indicates n⁺⁺ type emitter regions, numeral 222 indicates p⁺⁺ type body contact regions, numeral 224 indicates a gate insulation layer, numeral 226 indicates a gate electrode, numeral 228 indicates interlayer insulation layers, numeral 230 indicates an emitter electrode, and numeral 232 indicates a collector electrode. In the embodiment 6, the n⁺⁺ type emitter regions 220 correspond to second semiconductor regions of a first conductive type of the present invention.

The silicon carbide semiconductor device 200 according to the embodiment 6 basically has substantially the same configuration as the silicon carbide semiconductor device 100 according to the embodiment 1. However, as shown in FIG. 17, the silicon carbide semiconductor device 200 according to the embodiment 6 differs from the silicon carbide semiconductor device 100 according to the embodiment 1 with respect to a point that the silicon carbide semiconductor device 200 according to the embodiment 6 includes the p⁺ type low resistance silicon carbide substrate 210 as a low resistance silicon carbide substrate. That is, the silicon carbide semiconductor device 200 according to the embodiment 6 is an IGBT.

In this manner, the silicon carbide semiconductor device according to the embodiment 6 differs from the silicon carbide semiconductor device 100 according to the embodiment 1 with respect to a point that the silicon carbide semiconductor device according to the embodiment 6 includes the p⁺ type low resistance silicon carbide substrate 210 as the low resistance silicon carbide substrate, and the silicon carbide semiconductor device according to the embodiment 6 is an IGBT. However, the silicon carbide semiconductor device according to the embodiment 6 includes the p⁻ type channel regions 118 formed in the same manner as the silicon carbide semiconductor device 100 according to the embodiment 1 and hence, a channel length sufficiently long for preventing the occurrence of a short channel effect can be accurately defined in a practical process. Further, a drawback such as a change in a threshold value of a transistor or the occurrence of a punch-through minimally takes place.

The silicon carbide semiconductor device 200 according to the embodiment 6 has substantially the same configuration as the silicon carbide semiconductor device 100 according to the embodiment 1 except for that the silicon carbide semiconductor device 200 according to the embodiment 6 includes the p⁺ type low resistance silicon carbide substrate 210 as the low resistance silicon carbide substrate and the silicon carbide semiconductor device 200 according to the embodiment 6 is an IGBT. Accordingly, the silicon carbide semiconductor device 200 of the embodiment 6 can acquire advantageous effects which are brought about by its configurations which correspond to the configurations of the silicon carbide semiconductor device 100 of the embodiment 1 out of the advantageous effects which the silicon carbide semiconductor device 100 according to the embodiment 1 can acquire.

The present invention has been described heretofore with reference to the above-mentioned embodiments. However, the present invention is not limited to the above-mentioned embodiments. Various modifications are conceivable without departing from the gist of the present invention.

(1) In the above-mentioned respective embodiments, the present invention has been described assuming a first conductive type as an n type, and a second conductive type as a p type. However, the present invention is not limited to the above. The first conductive type may be a p type and the second conductive type may be an n type.

(2) In the above-mentioned respective embodiments, the present invention has been described by taking the silicon carbide semiconductor device where the transistor is formed into a stripe shape as an example. However, the present invention is not limited to the above. The present invention is also applicable to a silicon carbide semiconductor device where a transistor is formed into a square shape.

REFERENCE SIGNS LIST 100, 102, 104, 108, 200, 700: silicon carbide semiconductor device
110, 710: n⁺ type low resistance silicon carbide substrate
112, 212, 712: n⁻ type epitaxial layer
114, 214, 714: n type semiconductor region
116, 216, 716: p type body region
116a: outer peripheral surface of p type body region 116
118, 218, 318: p⁻ type channel region
120, 720: n⁺⁺ type source region
122, 222, 722: p⁺⁺ type body contact region
124, 224, 724: gate insulation layer
126, 226, 726: gate electrode
128, 228, 728: interlayer insulation layer
130, 730: source electrode
132, 720: drain electrode
134: n⁺ type semiconductor region
210: p⁺ type low resistance silicon carbide substrate 220: $n^{++}$ type emitter region
230: emitter electrode
232: collector electrode
M1, M2, M3, M4, M5, M6: mask

The invention claimed is:

1. A method of manufacturing a silicon carbide semiconductor device comprising:
an epitaxial layer of a first conductive type;
a first semiconductor region of a first conductive type formed on a surface of the epitaxial layer of the first conductive type, and having higher impurity concentration than that of the epitaxial layer of the first conductive type;
a body region of a second conductive type formed at a position deeper than that of the first semiconductor region of the first conductive type;
a channel region of a second conductive type formed such that
the channel region of the second conductive type penetrates the first semiconductor region of the first conductive type from a surface of the epitaxial layer of the first conductive type,
reaches the body region of the second conductive type, and
defines
a first part of the first semiconductor region of the first conductive type formed entirely on the body region of the second conductive type and
a second part of the first semiconductor region of the first conductive type formed partially on the body region of the second conductive type, wherein
the first part of the first semiconductor region of the first conductive type and the channel region of the second conductive type define a first boundary surface, and
the second part of the first semiconductor region of the first conductive type and the channel region of the second conductive type define a second boundary surface,
the channel region of the second conductive type having lower impurity concentration than that of the body region of the second conductive type;
a second semiconductor region of a first conductive type formed toward the body region of the second conductive type from the surface of the epitaxial layer of the first conductive type, the second semiconductor region of the first conductive type having higher impurity concentration than that of the first semiconductor region of the first conductive type;
a body contact region of a second conductive type formed such that the body contact region of the second conductive type penetrates the first semiconductor region of the first conductive type from the surface of the epitaxial layer of the first conductive type and reaches the body region of the second conductive type, the body contact region of the second conductive type having higher impurity concentration than that of the body region of the second conductive type; and
a gate electrode formed on at least the channel region of the second conductive type with a gate insulating film interposed therebetween, wherein
the channel region of the second conductive type and the second semiconductor region of the first conductive type are formed at a planar position where the first part of the first semiconductor region of the first conductive type
remains between the channel region of the second conductive type and the second semiconductor region of the first conductive type, and
separates the channel region of the second conductive type from the second semiconductor region of the first conductive type, and
the second boundary surface is positioned on the body region of the second conductive type as viewed in a plan view, wherein the method comprising the steps of:
preparing a silicon carbide semiconductor substrate provided with the epitaxial layer of the first conductive type;
forming the body region of the second conductive type on the surface of the epitaxial layer of the first conductive type such that a depth where a maximum concentration of an impurity of a second conductive type is deeper than a depth position of a bottom surface of the channel region;
forming the first semiconductor region of the first conductive type on a surface of the body region of the second conductive type;
forming the channel region of the second conductive type, the second semiconductor region of the first conductive type and a body contact region of a second conductive type in the first semiconductor region of the first conductive type, the body contact region of the second conductive type penetrating the first semiconductor region of the first conductive type from the surface of the epitaxial layer of the first conductive type and reaches the body region of the second conductive type; and
forming the gate electrode on at least the channel region of the second conductive type with a gate insulating film interposed therebetween, wherein
in the step of forming the channel region of the second conductive type, the second semiconductor region of the first conductive type and the body contact region of the second conductive type, the channel region of the second conductive type, the second semiconductor region of the first conductive type and the body contact region of the second conductive type are formed at a planar position where the first part of the first semiconductor region of the first conductive type remains between the channel region of the second conductive type and the second semiconductor region of the first conductive type, and
the second boundary surface is positioned on the body region of the second conductive type as viewed in a plan view.

2. The method according to claim 1, wherein the forming the gate electrode comprises forming an end portion of the gate electrode on the first semiconductor region of the first conductive type which remains between the channel region of the second conductive type and the semiconductor region of the first conductive type as viewed in a plan view.

3. The method according to claim 1, wherein the forming the gate electrode comprises forming an end portion of the gate electrode on the semiconductor region of the first conductive type as viewed in a plan view.

4. The method according to claim 1, further comprising a step of forming a third semiconductor region of a first conductive type between
(1) the first part of the first semiconductor region of the first conductive type, which remains between
(a) the channel region of the second conductive type and (b) the second semiconductor region of the first conductive type and (2) the second semiconductor region of the first conductive type, wherein the third semiconductor region of a first conductive type has impurity concentration that is higher than that of the first semiconductor region of the first conductive type and lower than that of the second semiconductor region of the first conductive type, and the forming the gate electrode comprises forming an end portion of the gate electrode on the third semiconductor region of the first conductive type as viewed in a plan view.

5. A method of manufacturing a silicon carbide semiconductor device comprising:

an epitaxial layer of a first conductive type;

a body region of a second conducive type formed at a predetermined depth position on a surface of the epitaxial layer of the first conductive type;

a channel region of a second conductive type formed such that the channel region of the second conductive type reaches the body region of the second conductive type from the surface of the epitaxial layer of the first conductive type, the channel region of the second conductive type having lower impurity concentration than that of the body region of the second conductive type;

a semiconductor region of a first conductive type formed toward the body region of the second conductive type from the surface of the epitaxial layer of the first conductive type, the semiconductor region of the first conductive type having higher impurity concentration than that of the epitaxial layer of the first conductive type;

a body contact region of a second conductive type formed such that the body contact region of the second conductive type reaches the body region of the second conductive type from the surface of the epitaxial layer of the first conductive type, the body contact region of the second conductive type having higher impurity concentration than that of the body region of the second conductive type, and a gate electrode formed on at least the channel region of the second conductive type with a gate insulating film interposed therebetween, wherein the channel region of the second conductive type and the semiconductor region of the first conductive type are formed at a planar position where the epitaxial layer of the first conductive type remains between the channel region of the second conductive type and the semiconductor region of the first conductive type and separates the channel region of the second conductive type from the semiconductor region of the first conductive type, and a boundary defined between the channel region of the second conductive type and the epitaxial layer of the first conductive type is positioned on the body region of the second conductive type as viewed in a plan view, wherein the method comprising the steps of:

preparing a silicon carbide semiconductor substrate provided with the epitaxial layer of the first conductive type;

forming the body region of the second conductive type on a surface of the epitaxial layer of the first conductive type within a predetermined depth region;

forming the channel region of the second conductive type, the second semiconductor region of the first conductive type and a body contact region of a second conductive type on the surface of the epitaxial layer of the first conductive type; and forming the gate electrode on at least the channel region of the second conductive type with a gate insulating film interposed therebetween, wherein in the step of forming the channel region of the second conductive type, the semiconductor region of the first conductive type and the body contact region of the second conductive type, the channel region of the second conductive type, the semiconductor region of the first conductive type and the body contact region of the second conductive type are formed at a planar position where the epitaxial layer of the first conductive type remains between the channel region of the second conductive type and the semiconductor region of the first conductive type, and the boundary defined between the channel region of the second conductive type and the epitaxial layer of the first conductive type is positioned on the body region of the second conductive type as viewed in a plan view.

6. The method according to claim 5, wherein the forming the gate electrode comprises forming an end portion of the gate electrode on the epitaxial layer of the first conductive type which remains between the channel region of the second conductive type and the semiconductor region of the first conductive type as viewed in a plan view.

7. The method according to claim 5, wherein the forming the gate electrode comprises forming an end portion of the gate electrode on the semiconductor region of the first conductive type as viewed in a plan view.

8. The method according to claim 5, further comprising a step of forming a third semiconductor region of a first conductive type between (1) a portion of the epitaxial layer of the first conductive type and the semiconductor region of the first conductive type, wherein the portion of the epitaxial layer of the first conductive type remains between (a) the channel region of the second conductive type and (b) the semiconductor region of the first conductive type, and (2) the semiconductor region of the first conductive type, wherein the third semiconductor region of a first conductive type has impurity concentration that is higher than that of the epitaxial layer of the first conductive type and lower than that of the semiconductor region of the first conductive type, and the forming the gate electrode comprises forming an end portion of the gate electrode on the third semiconductor region of the first conductive type as viewed in a plan view.

* * * * *